(12) United States Patent
Baike et al.

(10) Patent No.: US 10,249,802 B2
(45) Date of Patent: Apr. 2, 2019

(54) LIGHT EMITTING DEVICE AND METHOD FOR MANUFACTURING THE SAME

(71) Applicant: NICHIA CORPORATION, Anan-shi, Tokushima (JP)

(72) Inventors: Ikuko Baike, Komatsushima (JP); Ryo Suzuki, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/087,365

(22) Filed: Mar. 31, 2016

(65) Prior Publication Data

US 2016/0293810 A1    Oct. 6, 2016

(30) Foreign Application Priority Data

Apr. 2, 2015  (JP) ................................. 2015-076137
Mar. 11, 2016 (JP) ................................. 2016-048776

(51) Int. Cl.
*H01L 33/00*    (2010.01)
*H01L 33/52*    (2010.01)
(Continued)

(52) U.S. Cl.
CPC .......... *H01L 33/52* (2013.01); *H01L 33/0075* (2013.01); *H01L 33/32* (2013.01);
(Continued)

(58) Field of Classification Search
CPC ....... H01L 33/507; H01L 33/60; H01L 33/46; H01L 33/502; H01L 2933/0041; H01L 2224/73253
See application file for complete search history.

(56) References Cited

U.S. PATENT DOCUMENTS 5,998,925 A * 12/1999 Shimizu ............. C09K 11/7767
                                                    257/103
6,451,879 B1 * 9/2002 Mori .................... C08G 59/063
                                                    257/E23.119
(Continued)

FOREIGN PATENT DOCUMENTS

EP        2 535 954 A1    12/2012
JP      H08-125275 A       5/1996
(Continued)

OTHER PUBLICATIONS

Extended European Search Report issued in Application No. 16163210.4 dated Jun. 23, 2016.

*Primary Examiner* — Mary Wilczewski
*Assistant Examiner* — Tsz Chiu
(74) *Attorney, Agent, or Firm* — Foley & Lardner LLP

(57) ABSTRACT

A light emitting device includes a light emitting element having a first face, a second face opposing the first face, a plurality of side faces extending between the first face and the second face, a plurality of corners where the second face meets two of the plurality of side faces, and a pair of electrodes on a second face side of the light emitting element; a light transmissive member covering a portion of at least one of the side faces and a portion of an edge where said at least one side face meets the second face such that at least one of the plurality of corners is exposed from the light transmissive member; and a covering member covering the at least one exposed corner of the light emitting element and the exterior of the light transmissive member such that the pair of electrodes are exposed from the covering member.

24 Claims, 21 Drawing Sheets

(51) Int. Cl.
*H01L 33/60* (2010.01)
*H01L 33/32* (2010.01)
*H01L 33/40* (2010.01)
*H01L 33/20* (2010.01)
*H01L 33/38* (2010.01)
*H01L 33/50* (2010.01)

(52) U.S. Cl.
CPC .............. *H01L 33/40* (2013.01); *H01L 33/60* (2013.01); *H01L 33/20* (2013.01); *H01L 33/38* (2013.01); *H01L 33/505* (2013.01); *H01L 2933/005* (2013.01); *H01L 2933/0041* (2013.01)

(56) References Cited

U.S. PATENT DOCUMENTS

| | | | |
|---|---|---|---|
| 7,569,987 B2 * | 8/2009 | Naitou | C09K 11/0883 313/499 |
| 2011/0309388 A1 | 12/2011 | Ito et al. | |
| 2012/0025218 A1 * | 2/2012 | Ito | H01L 33/505 257/88 |
| 2012/0140506 A1 | 6/2012 | Waragawa et al. | |
| 2012/0236582 A1 | 9/2012 | Waragaya et al. | |
| 2013/0033169 A1 | 2/2013 | Ito et al. | |
| 2014/0131753 A1 | 5/2014 | Ishida et al. | |
| 2014/0220714 A1 | 8/2014 | Sorimachi | |
| 2014/0291716 A1 | 10/2014 | Ukawa | |
| 2015/0340577 A1 * | 11/2015 | Ishida | H01L 25/0753 257/98 |

FOREIGN PATENT DOCUMENTS

| | | |
|---|---|---|
| JP | 2001-250843 A | 9/2001 |
| JP | 2009-164275 A | 7/2009 |
| JP | 2010-219324 A | 9/2010 |
| JP | 2012-004303 A | 1/2012 |
| JP | 2012-041428 A | 3/2012 |
| JP | 2012-227470 A | 11/2012 |
| JP | 2013-012545 A | 1/2013 |
| JP | 2013-038187 A | 2/2013 |
| JP | 2014-112635 A | 6/2014 |
| JP | 2014-120722 A | 6/2014 |
| WO | WO-2013/005646 A1 | 1/2013 |

* cited by examiner

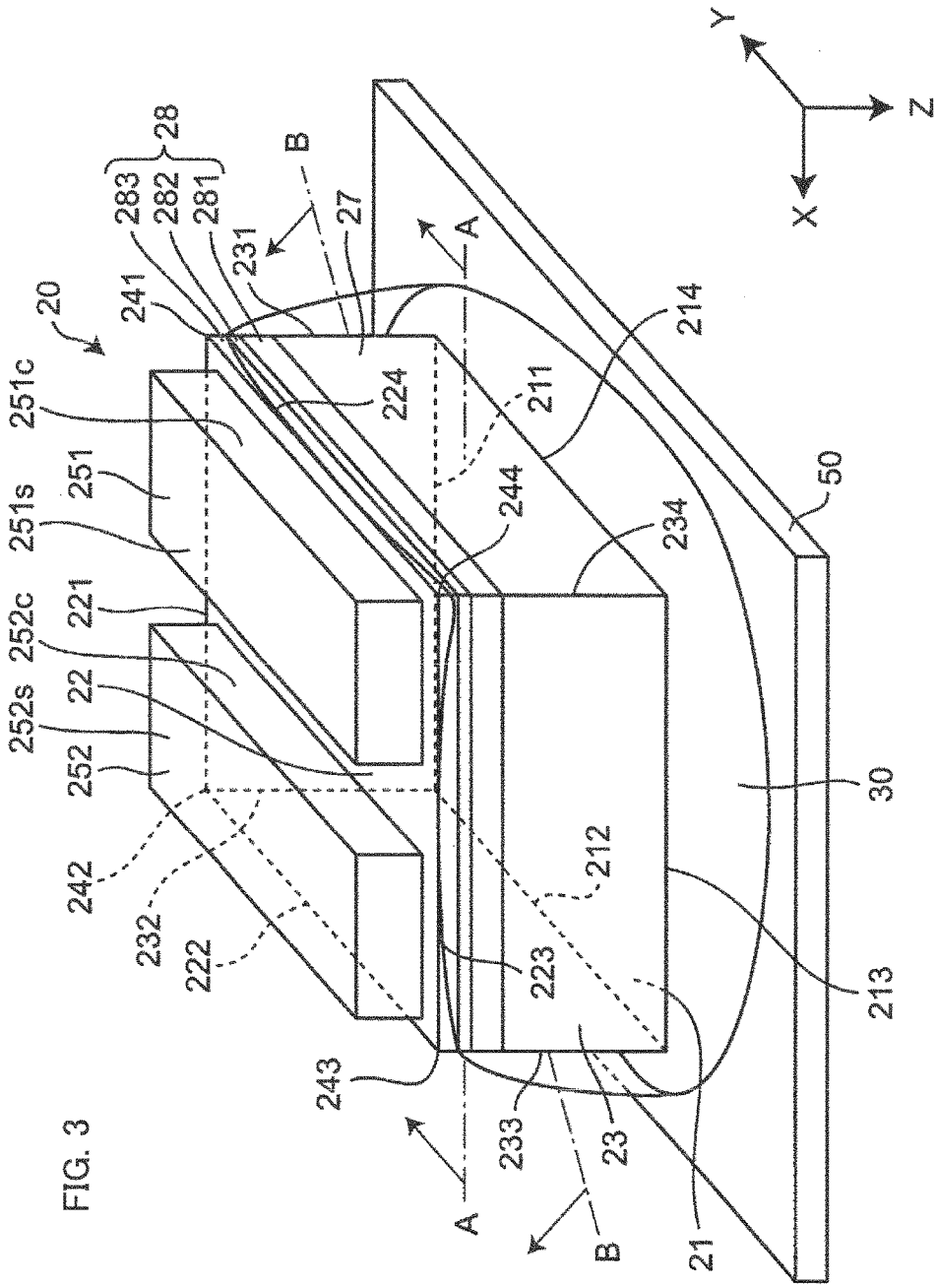

LIGHT EMITTING DEVICE AND METHOD FOR MANUFACTURING THE SAME

CROSS-REFERENCE TO RELATED APPLICATIONS

This application claims priority to Japanese Patent Application No. 2015-076137 filed on Apr. 2, 2015, and Japanese Patent Application No. 2016-048776 filed on Mar. 11, 2016. The entire disclosures of Japanese Patent Application No. 2015-076137 and Japanese Patent Application No. 2016-048776 are incorporated by reference herein.

BACKGROUND

The present disclosure relates to light emitting devices and method for manufacturing light emitting devices.

Light emitting devices having a reflector which covers the side faces of a light emitting element, in lieu of a housing for the light emitting element, have been known (for example, see Japanese Unexamined Patent Application Publication No. 2012-227470, Japanese Unexamined Patent Application Publication No. 2013-012545, International Patent Application Publication No. 2013/005646, and Japanese Unexamined Patent Application Publication No. 2010-219324.) For increasing the light extraction efficiency of these light emitting devices, a light transmissive member is disposed between the light emitting element and the reflector, and the light exiting the side faces of the light emitting element is extracted from the emission face through the light transmissive member.

SUMMARY

The light emitting device according to certain embodiments of the invention includes: a light emitting element having a first face, a second face opposing the first face, a plurality of side faces extending between the first face and the second face, a plurality of corners where the second face meets two of the plurality of side faces, and a pair of electrodes on a second face side of the light emitting element; a light transmissive member covering a portion of at least one of the side faces and a portion of an edge where said at least one side face meets the second face such that at least one of the plurality of corners is exposed from the light transmissive member; and a covering member covering the at least one exposed corner of the light emitting element and the exterior of the light transmissive member such that the pair of electrodes are exposed from the covering member; wherein a difference between a thermal expansion coefficient of the covering member and a thermal expansion coefficient of the light emitting element is smaller than a difference between a thermal expansion coefficient of the light transmissive member and the thermal expansion coefficient of the light emitting element.

BRIEF DESCRIPTION OF THE DRAWINGS

FIG. 3 is a schematic perspective view of the light emitting device according to Embodiment 1 showing the light transmissive member in an exposed state by omitting the covering member.

DESCRIPTION

Figure 1:
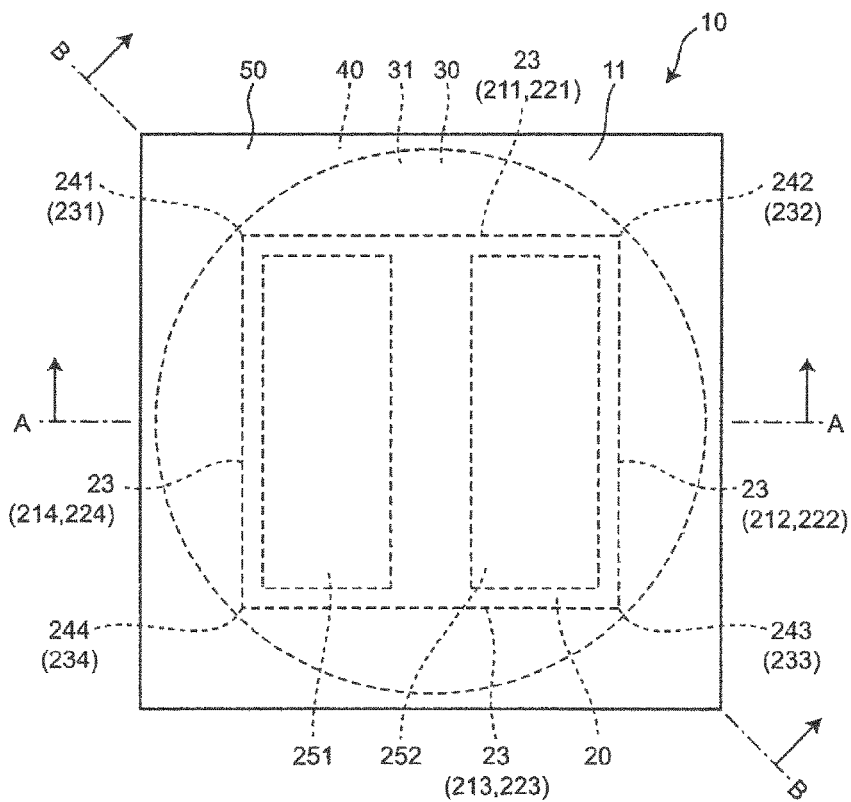
FIG. 1 is a schematic plan view of the light emitting device according to Embodiment 1.

Embodiments of the present invention will be explained in detail below based on drawings. In the explanations below, terms indicating certain directions and positions will be used as needed (for example, "upper," "lower," "right," "left," and other terms including these). These terms are used for the purpose of making the invention easily understood based on the drawings being referred to, and the technical scope of the invention should not be limited by the meanings of these terms. The portions denoted by the same reference numerals appearing in multiple drawings represent the same portions or components.

Embodiment 1

Figure 2A:
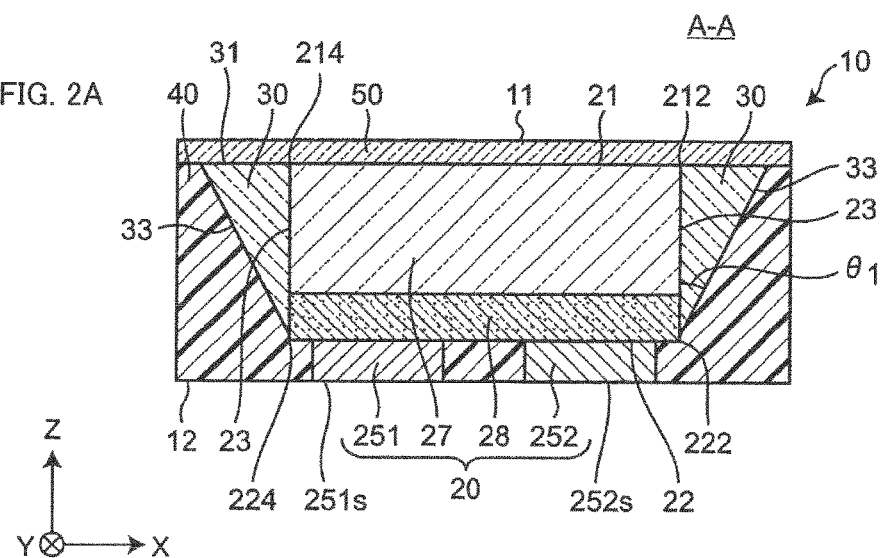
FIG. 2A is a schematic sectional view along line A-A indicated in FIG. 1.
Figure 2B:
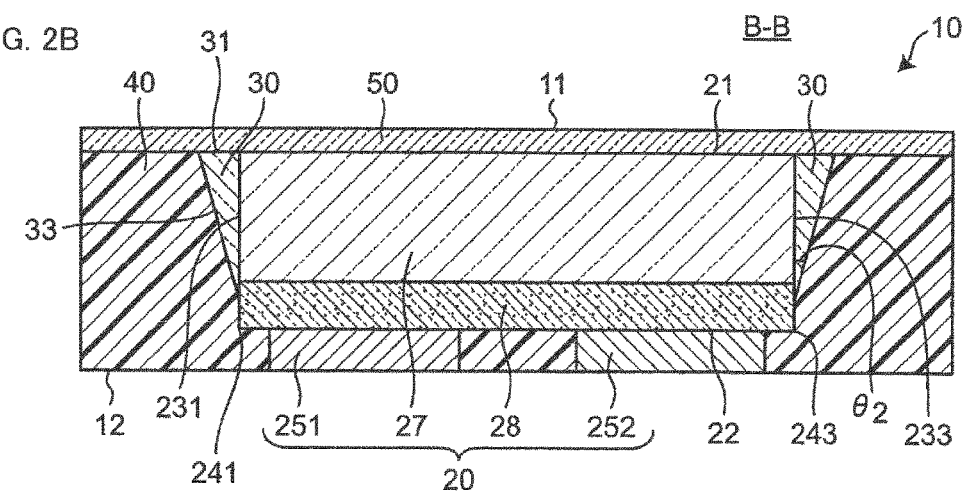
FIG. 2B is a schematic sectional view along line B-B indicated in FIG. 1.

The light emitting device 10 according to this embodiment shown in FIGS. 1, 2A and 2B includes a light emitting element 20, a light transmissive member 30 disposed on side faces 23 of the light emitting element 20, and a covering member 40 covering exterior 33 of the light transmissive member 30. The light emitting device 10 can include a wavelength converting member 50 on the first face (upper face) 11 side, which functions as the light emitting surface.

Such light transmissive member disposed between the light emitting element and the reflector may separate (detach) from the light emitting element. Since such separation may change the optical characteristics at the interface between the light emitting element and the light transmissive member, the amount of light extracted through the light transmissive member as well as the light distribution properties may vary. In other words, potential variations in the light emitting device's light extraction efficiency and the light distribution properties by the separation of the light transmissive member may make it difficult to maintain consistency in the quality of the light emitting device to guarantee a sufficient level of reliability. Accordingly, an object of certain embodiments of the present invention is to provide a highly reliable light emitting device by reducing separation between the light transmissive member and the light emitting element.

According to certain embodiments of the present invention, the separation of the light transmissive member from the light emitting element can be reduced, and the reliability of the light emitting device can be improved.

FIG. 2A is a schematic sectional view along line A-A which is a line perpendicular to a pair of opposing side faces 23 of the light emitting element 20 indicated in FIG. 1. FIG. 2B is a schematic sectional view along line B-B which is a line consistent with the diagonal line of the rectangular light emitting element 20 in a top view indicated in FIG. 1. As shown in FIGS. 2A and B, the light emitting element 20 can include a light transmittive substrate 27 and a semiconductor stack 28 formed on a lower face side of the light transmittive substrate 27. The light emitting element 20 has a first face (upper face) 21 on the light transmittive substrate 27 side, a second face (lower face) 22 on the semiconductor stack 28 side opposite the first face 21, and plural side faces 23 between the first face 21 and the second face 22. The light emitted at the light emitting element 20 travels from the semiconductor stack 28 through the light transmittive substrate 27, or from the semiconductor stack 28 through the side faces 23 and the light transmissive member 30 of the light emitting element 20, to be extracted from the first face 11 of the light emitting device 10.

On the second face 22 of the light emitting element 20 (that is, on the semiconductor stack 28 side in FIGS. 2A and B), a pair of electrodes 251 and 252 is provided for supplying electrical current to the light emitting element 20. In this specification, the "second face 22" of the light emitting element 20 refers to the face of the light emitting element 20 excluding the electrodes 251 and 252. In this embodiment, the second face 22 coincides with the lower face of the semiconductor stack 28.

Figure 4:
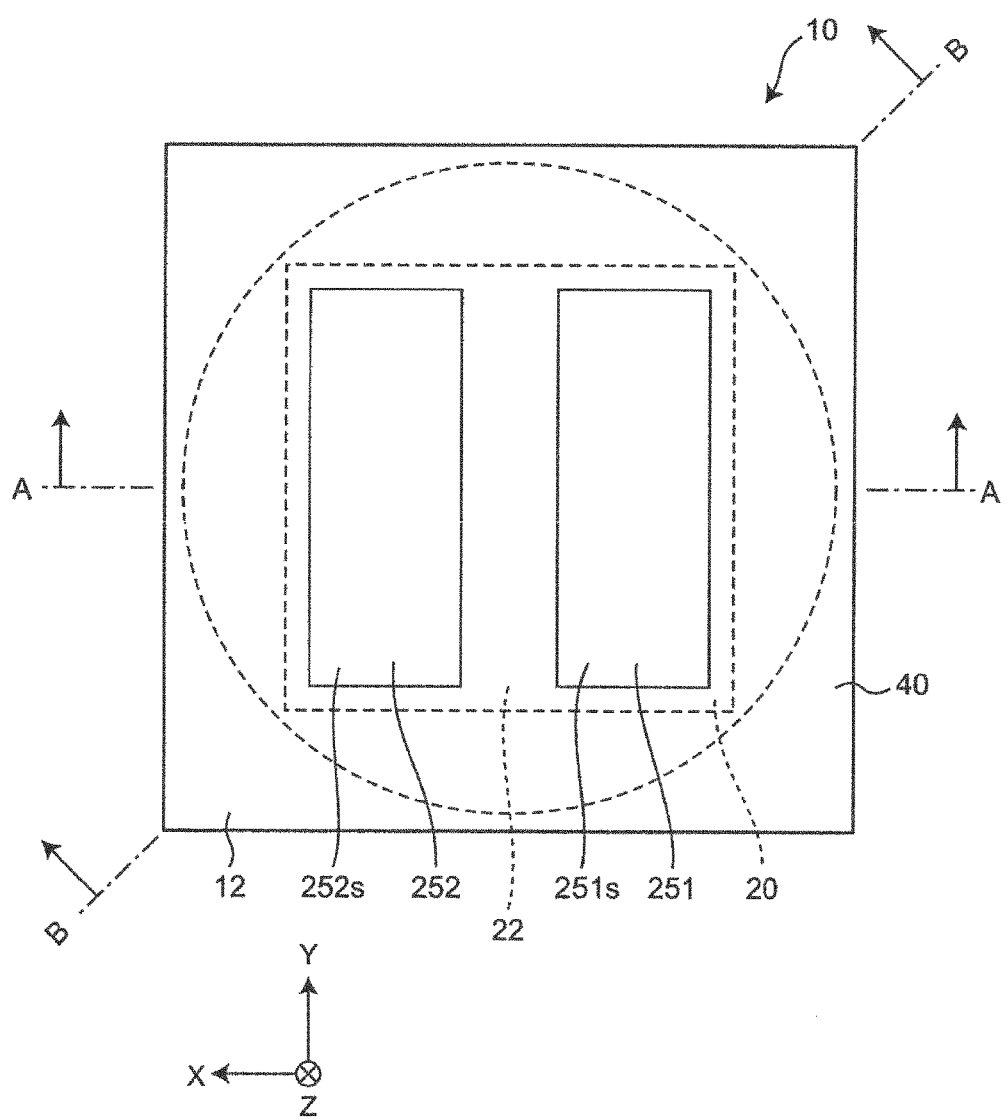
FIG. 4 is a schematic bottom view of the light emitting device according to Embodiment 1.

The two electrodes 251 and 252 comprising the pair of electrodes can each be shaped as desired. In the light emitting device 10 shown in FIG. 4, for example, the electrodes 251 and 252 can each be an oblong extending in one direction (y direction) when viewed from the second face 12 side of the light emitting device 10 (i.e., viewed in z direction). The electrodes 251 and 252 may not have the same shape. Moreover, the electrodes 251 and 252 can be arranged as desired, so long as they are spaced apart. In FIG. 4, the two electrodes 251 and 252 are arranged along y direction in parallel.

Referring back to FIG. 2A, the light transmissive member 30 covers the side faces 23 of the light emitting element 20, and guides the light exiting the side faces 23 towards the first face 11 of the light emitting device 10. The light reaching the side faces 23 of the light emitting element 20 can be extracted through the light transmissive member 30 before light is attenuated inside the light emitting element 20 by reflecting at the side faces 23. Providing the light transmissive member 30 can increase the light extraction efficiency of the light emitting device 10 by reducing a loss of light.

When the side faces 23 of the light emitting element 20 are oblique relative to the second face 22, providing the light transmissive member 30 may be particularly effective. For example, in the cases where the light emitting elements 20 are separated by using cleavage in the manufacturing method, the side faces 23 of the light emitting elements 20 might not always be perpendicular to the second face 22. In general, in the cross portion along line A-A in FIG. 1, such light emitting element 20 is a parallelogram. In other words, the light emitting element 20 has the first face 21 and the second face 22 that are in parallel, and two opposing side faces 23 that are in parallel, where each side face 23 is oblique relative to the first and second faces 21 and 22. Since one of the side faces 23 forms an obtuse angle with the second face 22, the light reflected by this side face 23 can travel towards the first face 21 to be extracted from the light emitting device 10 as is. However, since the other side face 23 forms an acute angle with the second face 22, the light towards the second face 22 tends to be reflected by the second face 22 and attenuated inside the light emitting element 20.

By covering the latter side face 23 with the light transmissive member 30, the light reaching that side face 23 can be efficiently extracted from the light emitting device 10 through the light transmissive member 30.

FIG. 3 shows the light emitting device 10 in a state in which the covering member 40 is omitted so that the coverage of the light emitting element 20 by the light transmissive member 30 can be easily understood. Moreover, in order for the corners where the second face 22 of the light emitting element 20 meets two side faces 23 (referred to as the "second face 22 side corners") to be more visually recognizable, the light emitting element 20 is shown with the second face 22 side up.

The light transmissive member 30 does not cover the side surfaces 23 entirely, but covers the side surfaces 23 partially. For this reason, more specifically, in the vicinities of the second face 22 side corners 241, 242, 243, and 244 of the light emitting element 20, the side faces 23 are not covered by the light transmissive member 30 and thus exposed. The edges of the light emitting element 20 extending from the corners 241, 242, 243, and 244 in z direction (referred to as the "third edges 231, 232, 233, and 234") are also exposed by not being covered by the light transmissive member 30 in the vicinities of these corners (see FIGS. 3 and 2B). Now, since the portions of the side faces 23 not covered by the light transmissive member 30 (the exposed portions of the side faces 23) are covered by the covering member 40 described later, they are not exposed at the exterior of the light emitting device 10.

As shown in FIGS. 2A and B, the covering member 40 covers the exterior 33 of the light transmissive member 30 and the exposed portions of the side faces 23 of the light emitting element 20 (FIG. 3). The covering member 40 is formed with a material that satisfies prescribed relationships with the light transmissive member 30 and the light emitting element 20 in terms of the magnitude of thermal expansion coefficient. More specifically, the material for the covering member 40 is selected so as to satisfy $\Delta T_{40} < \Delta T_{30}$ when comparing the thermal expansion coefficient difference between the light transmissive member 30 and the light emitting element 20 referred to as the "first thermal coefficient difference $\Delta T_{30}$" with the thermal expansion coefficient difference between the covering member 40 and the light emitting element 20 referred to as the "second thermal coefficient difference $\Delta T_{40}$". In other words, the material for the covering member 40 is selected so that the thermal expansion coefficient of the covering member is lower than the thermal expansion coefficient of the light transmissive member. This can reduce the light transmissive member 30 from becoming separated from the light emitting element 20. The mechanism for reducing the separation of the light transmissive member 30 is believed to be as follows.

The cause for the separation of the light transmissive member 30 from the light emitting element 20 is primarily the heat generated when the light emitting element 20 is turned on. In the cases where the light emitting element 20 is a semiconductor light emitting element while the light transmissive member 30 is a resin, the thermal expansion coefficient of the light transmissive member 30 (for example, coefficient of linear thermal expansion, Young's modulus, or the like) is at least 10 times that of the light emitting element 20. For this reason, when the light emitting element 20 is turned on, tensile stress attributable to the difference in the amount of thermal expansion between the light emitting element 20 and the light transmissive member 30 is generated at the interface between the light emitting element 20 and the light transmissive member 30. The stress is eliminated when the light emitting element 20 is turned off. In other words, repeated on/off operations of the light emitting element 20 generates tensile stress at the interface between the light emitting element 20 and the light transmissive member 30 each time it is turned on, which weakens the adhesion at the interface between the light emitting element 20 and the light transmissive member 30, eventually allowing the light transmissive member 30 to separate from the light emitting element 20.

As described above, the light transmissive member 30 is provided for extracting the light reaching the side faces 23 of the light emitting element 20 before it is reflected by the side faces 23 to be attenuated within the light emitting element. Thus, the optical characteristics at the interface between the light emitting element 20 and the light transmissive member 30 may change when the light transmissive member 30 is separated from the light emitting element 20. In other words, a portion of the light reaching the side faces 23 of the light emitting element 20 can be reflected by the side faces 23 without exiting to the light transmissive member 30. As a result, the amount of light extracted through the light transmissive member 30 after the separation could decline as compared to that without the separation. This may reduce the light extraction efficiency of the light emitting device 10, as well as changing the light distribution properties of the light emitting device 10. In the light emitting device according to the embodiment of this invention, a light transmissive member 30 is employed, and the light transmissive member 30 may reduced from becoming separated from the light emitting element 20, a highly reliable light emitting device 10 capable of maintaining consistency in the quality can be provided by being resistant to changes in the light extraction efficiency and the light distribution properties even after long term use.

Upon observing the situations involving the separations of the light transmissive member 30, it was found that such separations readily originate at the second face 22 side corner 241, 242, 243, or 244 of the light emitting element 20 shown in FIGS. 2B and 3. This is believed to be because the tensile stress occurring at the interface between the light emitting element 20 and the light transmissive member 30 is concentrated at the corners. Particularly, the second face 22 side of the light emitting element 20 where the semiconductor stack 28 is formed readily generates heat, and thus, among all corners of the light emitting element 20, the second face 22 side corners 241, 242, 243, and 244 are considered to be more vulnerable to separation. Moreover, in the instances where no separation of the light transmissive member 30 was observed at the second face 22 side corner 241, 242, 243, or 244 of the light emitting element 20, the light transmissive member 30 was not separated at the side faces 23 of the light emitting element 20, either. In other words, reducing the separation of the light transmissive member 30 at the second face 22 side corners 241, 242, 243, and 244 of the light emitting element 20 can effectively reduce the separation of the light transmissive member 30.

Accordingly, in certain embodiments of the invention, as shown in FIGS. 1A, 1B, and 3, the light extraction efficiency is increased by covering the vast majority of the side faces 23 of the light emitting element 20 with the light transmissive member 30, while reducing the separation of the light transmissive member 30 covering the side faces 23 by covering the second face 22 side corners 241, 242, 243, and 244 of the light emitting element 20 with a component (covering member 40) that is not vulnerable to separation from the light emitting element 20 (in lieu of the light transmissive member 30). As discussed above, the separation may be caused by a large difference in the thermal expansion coefficients between the light emitting element 20 and the component that covers it. Accordingly, when comparing the "first thermal coefficient difference $\Delta T_{30}$," which is the thermal expansion coefficient difference between the light transmissive member 30 and the light emitting element 20, with the "second thermal coefficient difference $\Delta T_{40}$," which is the thermal expansion coefficient difference between the covering member 40 and the light emitting element 20, their relationship is expressed as follows: the second thermal coefficient difference $\Delta T_{40}$<the first thermal coefficient difference $\Delta T_{30}$. In other words, the material for the covering member 40 is selected so that the thermal expansion coefficient of the covering member is lower than the thermal expansion coefficient of the light transmissive member. With this arrangement, the probability of the separation of the light transmissive member 30 when the second face 22 side corners 241, 242, 243, and 244 of the light emitting element 20 are covered with the covering member 40 can be lower than the probability of the separation of the light transmissive member 30 when the second face 22 side corners 241, 242, 243, and 244 of the light emitting element 20 are covered with the light transmissive member 30. Accordingly, this can reduce the probability of the separation of the light transmissive member 30 covering the side faces 23 of the light emitting element 20.

With respect to the thermal expansion coefficients of the components, the thermal expansion coefficient of the light emitting element 20 is, for example, in a range between 7 and 10 ppm/° C. The thermal expansion coefficient of the light transmissive member 30, if a resin is used as the base material, is in a range between 200 and 300 ppm/° C., for example, under the temperature conditions of at least the glass transition point (Tg). The thermal expansion coefficient of the covering member 40, if a resin is used as a base material, is in a range between 45 and 100 ppm/° C., for example, under the temperature condition of at least the glass transition point (Tg).

To give a specific example, assuming that the thermal expansion coefficients of the light emitting element 20, light transmissive member 30, and covering member 40 are 7 ppm/° C., 200 ppm/° C., and 45 ppm/° C., respectively, the first thermal coefficient difference $\Delta T_{30}=(200-7)=193$ ppm/° C., and the second thermal coefficient difference $\Delta T_{40}=(45-7)=38$ ppm/° C. This therefore satisfies the relationship: the second thermal coefficient difference $\Delta T_{40}$<the first thermal coefficient difference $\Delta T_{30}$.

In this specification, the term "the thermal expansion coefficient of the light emitting element 20" means the thermal expansion coefficient of the light emitting element 20 as a whole. For example, when the light emitting element 20 includes multiple materials, such as the semiconductor stack 28, as shown in FIGS. 2A and B, the term refers to the thermal expansion coefficient of those as a whole.

As shown in FIG. 3, when the second face 22 side corners 241, 242, 243, and 244 of the light emitting element 20 are exposed by not being covered by the light transmissive member 30, the side faces 23 of the light emitting element 20 in the vicinities of the corners 241, 242, 243, and 244 are also exposed and not covered by the light transmissive member 30. The light reaching the exposed portions of the side faces 23 not in contact with the light transmissive member 30 cannot be extracted from the light emitting device 10 through the light transmissive material 30. From the perspective of the light extraction efficiency of the light emitting device 10, it is preferable that the areas of the exposed portions of the side faces 23 is small. On the other hand, the exposed portions of the side faces 23 are covered by the covering member 40, and thus from the perspective of preventing the light transmissive member 30 from separating, it is preferable that the areas of the exposed portions is large. Accordingly, a number of variations can be considered for the shapes and the locations of the exposed portions in accordance with the objectives.

Using the light emitting element 20 having substantially the rectangular parallelepiped shape and including the four second face 22 side corners 241, 242, 243, and 244 shown in FIG. 3 as an example, several variations will be explained. In the example shown in FIG. 3, the semiconductor stack 28 includes three semiconductor layers: a first conductive type semiconductor layer 281, an emission layer 282, and a second conductive type semiconductor layer 283. Among the three semiconductor layers 281, 282, and 283 exposed at the side faces of the semiconductor stack 28, the first conductive type semiconductor layer 281 and the emission layer 282 are completely covered by the light transmissive member 30, while only a portion of the second conductive type semiconductor layer 283 is exposed and not covered by the light transmissive member 30.

In Variation Example 1, only one corner, for example, the corner 244 in FIG. 3, can be exposed while covering the three remaining corners 241, 242, and 243 with the light transmissive member 30. With this arrangement, the light extraction efficiency can be high because the side faces 23 of the light emitting element 20 are largely covered with the light transmissive member 30 up to the corners 241, 242, and 243. Since the exposed corner 244 not covered by the light transmissive member 30 is covered by the covering member 40, as shown in FIG. 2B, the separation of the light transmissive member 30 from the light emitting element 20 can be reduced in the vicinity of the corner 244.

In Variation Example 2, two corners diagonally positioned, for example, the corners 241 and 243 in FIG. 3, can be exposed, while covering the remaining two corners 242 and 244 with the light transmissive member 30. The light extraction efficiency can be good because the side faces 23 of the light emitting element 20 are covered with the light transmissive member 30 up to the corners 242 and 244. Since the exposed corners 241 and 243 not covered by the light transmissive member 30 are covered by the covering member 40, as shown in FIG. 2B, the separation of the light transmissive member 30 from the light emitting element 20 can be reduced in the vicinities of the corners 241 and 243. The stress generated at the interface between the light emitting element 20 and the covering member 40 can be moderated at the two diagonally positioned corners 241 and 243, and thus even at the corners 242 and 244 positioned between them, the effect of moderating the stress occurring at the interface between the light emitting element 20 and the light transmissive member 30 can be expected.

In Variation Example 3, two adjacent corners, for example, the corners 243 and 244 in FIG. 3, can be exposed, while covering the two remaining corners 241 and 242 with the light transmissive member 30. The light extraction efficiency can be good because the side faces 23 of the light emitting element 20 are covered with the light transmissive member 30 up to the corners 241 and 242. Since the exposed corners 243 and 244 not covered by the light transmissive member 30 are covered by the covering member 40, as shown in FIG. 2B, the separation of the light transmissive member 30 from the light emitting element 20 can be suppressed in the vicinities of the corners 243 and 244. At this time, the edge 223 located between the two corners 243 and 244 may also be exposed by not being covered by the light transmissive member 30 to be covered by the covering member 40, which can further enhance the separation reduce effect.

In Variation Example 4, three corners, for example, corners 241, 242, and 243 in FIG. 3, can be exposed, while covering the remaining corner 244 with the light transmissive member 30. The light extraction efficiency can be good because the side faces 23 of the light emitting element 20 are largely covered with the light transmissive member 30 up to the corner 244. Since the exposed corners 241, 242 and 243 not covered by the light transmissive member 30 are covered by the covering member 40, as shown in FIG. 2B, the separation of the light transmissive member 30 from the light emitting element 20 can be effectively reduced in the vicinities of the corners 241, 242, and 243.

In Variation Example 5, all four corners (corners 241, 242, 243, and 244 in FIG. 3) can be exposed by not being covered by the light transmissive member 30. Since the exposed corners 241, 242, 243, and 244 not covered by the light transmissive member 30 are covered by the covering member 40, as shown in FIG. 2B, the effectiveness in reducing the light transmissive member 30 from separating from the light emitting element 20 in the vicinities of the corners 241, 242, 243, and 244 can be improved.

Using the light emitting element 20 exposing all four corners 241, 242, 243, and 244 by not covering with the light transmissive member 30 (i.e., Variation Example 5) as an example, the manner in which the light emitting element 20 is covered by the light transmissive member 30 will be described in detail with reference to FIG. 3. In FIG. 3, the four edges of the light emitting element 20 where the first face 21 meets the side faces 23 are referred to as the "first edges 211, 212, 213, and 214," the four sides where the second face 22 meets the side faces 23 are referred to as the "second edges 221, 222, 223, and 224," and the four sides where two adjacent side faces 23 meet are referred to as the "third edges 231, 232, 233, and 234."

The first edges 211, 212, 213, and 214 surround the first face 21 of the light emitting element 20 are covered by the light transmissive member 30 entirely. The third edges 231, 232, 233, and 234 extending from the first face 21 to the second face 22 are mostly covered by the light transmissive member 30, except for the vicinities of the second face 22 (i.e., vicinities of the second face 22 side corners 241, 242, 243, and 244). The second edges 221, 222, 223, and 224 surround the second face 22 of the light emitting element 20 are covered by the light transmissive member 30 at the portions excluding the second face 22 side corners 241, 242, 243, and 244 (around the center of each side in FIG. 3), but the rest is exposed and not covered by the light transmissive member 30. By covering the light emitting element 20 with the light transmissive member 30 in this manner, the vast majority of the side faces 23 of the light emitting element 20 are covered by the light transmissive member 30, while exposing the second face 22 side corners 241, 242, 243, and 244 of the light emitting element 20.

As discussed above, FIG. 3 shows the case where all of the second face 22 side corners 241, 242, 243, and 244 of the light emitting element 20 are exposed by not being covered by the light transmissive member 30 (i.e., Variation Example 5). Accordingly, if one or more of the corners were covered by the light transmissive member 30 like Variation Examples 1 to 4, the coverage of the second edges 221, 222, 223, and 224 as well as the third edges 231, 232, 233, and 234 by the light transmissive member 30 can increase. For example, in the case where the corner 244 is covered by the light transmissive member 30, the corner 244 side ends of the second edges 223 and 224 extending from the corner 244 are be covered by the light transmissive member 30, and the third edge 234 extending from the corner 244 is covered by the light transmissive member 30 across its entire length.

Referring back to FIG. 2A, the light transmissive member 30 covering the side faces 23 of the light emitting element 20 may go beyond the first edges (reference numerals 212 and 214 in FIG. 2A) of the light emitting element 20 to partially or entirely cover the first face 21. The first face 21 of the light emitting element 20 can be protected by the light transmissive member 30. In the cases where a wavelength converting member 50 is disposed on the first face 21 side of the light emitting element 20, moreover, disposing the light transmissive member 30 between the first face 21 of the light emitting element 20 and the wavelength converting member 50 allows the light transmissive member 30 to function as an adhesive to adhere the first face 21 to the wavelength converting member 50.

In FIG. 3, the light transmissive member 30 covering the side faces 23 of the light emitting element 20 is preferably formed so as to reach the second edges 221, 222, 223, and 224 in portions, but not exceed the second edges. In other words, as shown in FIG. 3, the upper edge of the light transmissive member 30 is positioned lower than the second edges 221, 222, 223, and 224 in the vicinities of the corners 241, 242, 243, and 244, but otherwise coincides with the second edges. The light transmissive member 30 having such shape can be easily formed by using a liquid resin material as the raw material for the light transmissive member 30, and utilizing the liquid resin's wetting and spreading over the side faces 23 of the light emitting element 20 by surface tension. Moreover, by providing stepped portions in the locations where the second face 22 intersects with the side faces 23 of the light emitting element 20, the liquid resin can be reduced from wetting and spreading beyond the stepped portions onto the second face 22. Such stepped portions can be created, for example, by removing a portion of the semiconductor stack 28 of the light emitting element 20, more preferably only a portion of the second conductive type semiconductor layer 283 which is close to the second face 22 of the light emitting element 20.

The light transmissive member 30 preferably covers the emission layer 282 exposed at the side faces 23 of the light emitting 20 as largely as possible, particularly preferably completely. This allows the light emitted from the emission layer 282 to be efficiently extracted out of the light emitting element 20 through the light transmissive member 30.

The upper edge of the light transmissive member 30 is not limited to not exceeding the second edges 221, 222, 223, and 234 of the light emitting element 20. In other words, the upper edge of the light transmissive member 30 may exceed the second edge 221, 222, 223, or 234 of the light emitting element 20 to partially cover the second face 22. However, largely covering the second face 22 with the light transmissive member 30 may increase the occurrence of the interfacial separation between the second face 22 and the light transmissive member 30.

As shown in FIGS. 2A, 2B, and 3, the exterior 33 of the light transmissive member 30 is preferably oblique outwardly from the second face 22 side towards the first face 21 side of the light emitting element 20. In other words, in the sectional views shown in FIGS. 2A and 2B, the exterior 33 appearing on the left and right hand sides of the light transmissive member 30 preferably spreads apart towards the first face (emission face) 11 of the light emitting device 10. The light exiting the side faces 23 of the light emitting element 20 and propagating in the light transmissive member 30 reaches the oblique exterior 33. At this point, the light being reflected by the exterior 33 can be directed towards the first face 11 of the light emitting device 10. This can increase the light extraction efficiency of the light emitting device 10.

In a sectional view in parallel to one side face 23 of the light emitting element 20 in a plan view (the portion along line A-A indicated in FIG. 1, i.e., FIG. 2A), the angle formed by another side face 23 orthogonal to this side face 23 and the exterior 33 of the light transmissive member 30 covering the side face 23 (denoted as the "tilt angle $\theta_1$") preferably falls in an appropriate range. More specifically, the tilt angle $\theta_1$ is preferably from 40° to 60° and, for example, can be set to 45°. The outline shape of the first face 31 of the light transmissive member 30 (drawn substantially circular in FIG. 1) is increased in size as the tilt angle $\theta_1$ is increased, thereby increasing the light extraction efficiency. On the other hand, the outline shape of the first face 31 can be reduced in size as the tilt angle $\theta_1$ is decreased, and thus the dimension of each side of the light emitting device 10 can be reduced in a top view (i.e., the light emitting device 10 can be made more compact). Considering both the light extraction efficiency and the compactness of the light emitting device 10, the tilt angle $\theta_1$ of 45° is preferable.

In a sectional view along the diagonal line of the light emitting element 20 (the portion along line B-B indicated in FIG. 1, i.e., FIG. 2B), the angle formed by a third edge (reference numeral 231 or 233 in FIG. 2B) and the exterior 33 of the light transmissive member 30 covering the third edge (denoted as the "tilt angle $\theta_2$") is smaller than the tilt angle $\theta_1$. That is, as shown in FIGS. 2A and 2B, the tilt angle $\theta_2$<the tilt angle $\theta_1$.

The exterior 33 of the light transmissive member 30 may be provided with edges originating from the points where the exterior 33 meets the third edges 231, 232, 233, and 234 of the light emitting element 20 shown in see FIG. 3. In the case where edges are present in the exterior 33, however, when the light entering the light transmissive member 30 from the side faces 23 of the light emitting element 20 is reflected by the interface between the exterior 33 of the light transmissive member 30 and the covering member 40 (see FIGS. 2A and 2B), the light may be repeatedly reflected by the faces positioned on both sides of each edge (i.e., the two faces forming an edge) in the vicinities of the edges. Light may lose its intensity as it is gradually absorbed while being repeatedly reflected, which can lead to a reduction in the light extraction efficiency of the light emitting device 10. In order to increase the light extraction efficiency, the absence of edges in the exterior of the light transmissive member 30, i.e., the exterior 33 of the light transmissive member 30 formed as a smooth continuous curved surface as shown in FIG. 3, is preferable. This can reduce multiple reflections occurring within the light transmissive member 30 thereby increasing the light extraction efficiency of the light emitting device 10.

The exterior 33 of the light transmissive member 30 in the sectional views shown in FIGS. 2A and 2B may have a straight line, but may also have a curved line. Here, a "curved line" may be either an outwardly (towards the covering member 40) or inwardly (towards the light emitting element 20) protruded curve. From the light extraction efficiency perspective, the exterior 33 is preferably formed as an outwardly protruded curve.

Figure 20:
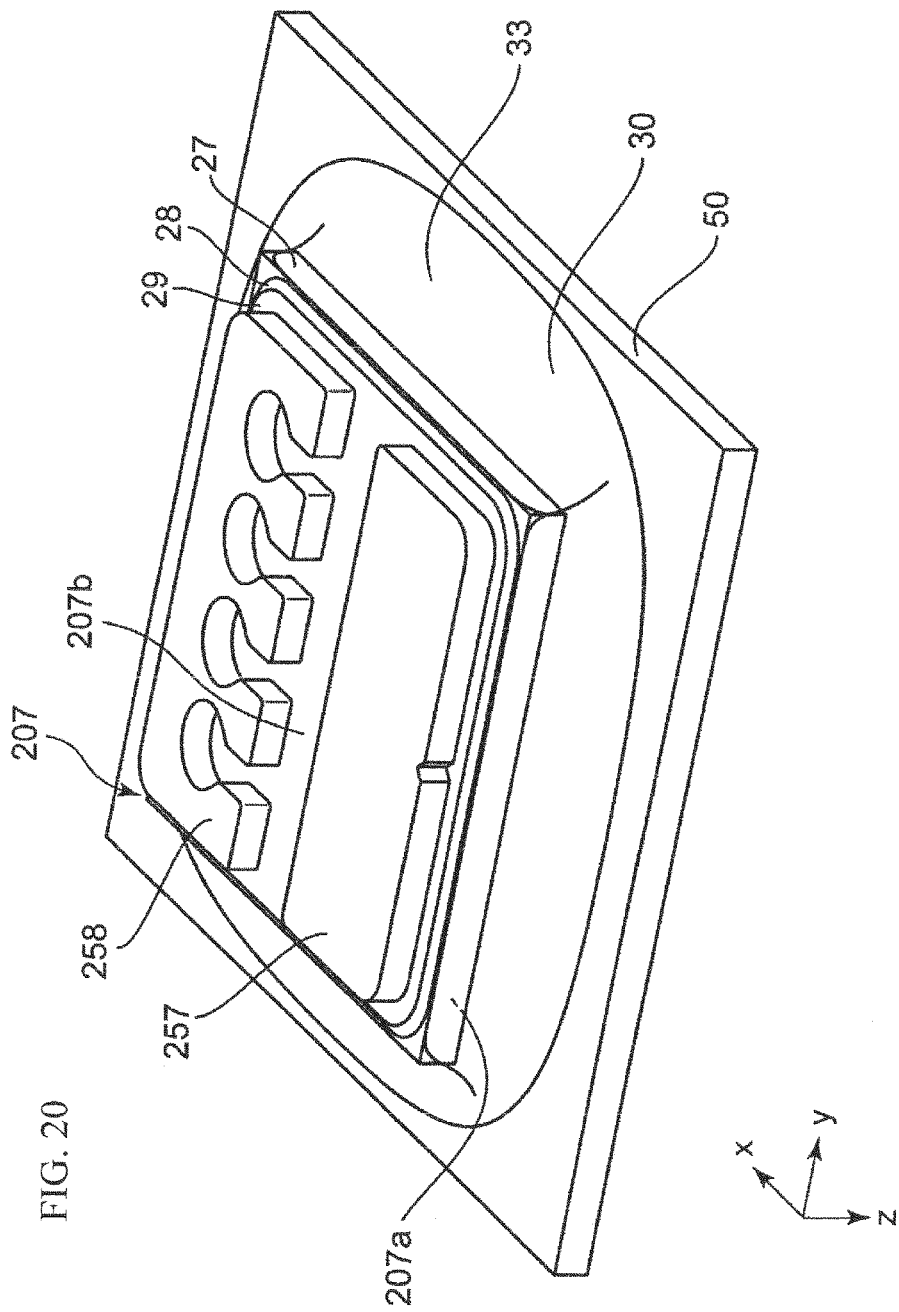
FIG. 20 is a schematic perspective view of the light emitting device according to Embodiment 3 showing the light transmissive member in an exposed state by omitting the covering member.

The exterior 33 having an outwardly protruded curve in a sectional view is dome shaped in a perspective view as shown in FIG. 3. The exterior 33 having an inwardly protruded curve in a sectional view is trumpet shaped (flared) as shown in FIG. 20.

In the cases where the light emitting element 20 includes a light transmittive substrate 27 and a semiconductor stack 28, as shown in FIG. 2, the light transmittive substrate 27 can be positioned on the first face 21 side of the light emitting element 20, and the semiconductor stack 28 can be positioned on the second face 22 side. When the light emitting element 20 is turned on, heat is generated at the emission layer (reference numeral 282 in FIG. 3) included in the semiconductor stack 28, and thus the light transmissive member 30 is vulnerable to separation from the light emitting element 20 in the vicinity of the semiconductor stack 28. As shown in FIG. 2B, on the second face 22 side of the light emitting element 20, the corners of the light emitting element 20 (reference numerals 241 and 243 in FIG. 2B) are exposed by not being covered by the light transmissive member 30, but are covered by the covering member 40. Thus, separation of the light transmissive member 30 from the light emitting element 20 on the second face 22 side of the light emitting element 20 is reduced. Accordingly, positioning the semiconductor stack 28, which is the heat generation source that causes the separation, on the second face 22 side of the light emitting element 20 can effectively reduce the separation of the light transmissive member 30.

FIG. 4 shows the light emitting device 10 viewed from the second face 12 side. The pair of electrodes 251 and 252 of the light emitting element 20 are not covered by the covering member 40 and exposed at the second face (lower face) 12 of the light emitting device 10. This allows the electrodes 251 and 252 of the light emitting element 20 to be connected to the external electrodes provided on a substrate, or the like, on which the light emitting element 20 will be mounted. The light emitting element 20 is preferably covered by the covering member 40 entirely, except for the portions of the second face 22 where the electrodes 251 and 252 are disposed, for the purpose of protecting the light emitting element 20 from the external environment.

The second face 22 of the light emitting element 20 is covered by the covering member 40 so as to expose the electrodes 251 and 252 formed on the second face 22 of the light emitting element 20 at the surface (second face 12) of the light emitting device 10. For example, the side faces (reference numerals 251c and 252c in FIG. 3) of the electrodes 251 and 252 may be covered by the covering member 40, but the thickness of the covering member 40 is adjusted so as not to cover the surfaces 251s and 252s of the electrodes 251 and 252. The surfaces 251s and 252s of the electrodes 251 and 252 may be projected from the covering member 40 or substantially flush therewith (see FIG. 2A).

Referring back to FIGS. 2A and B, as described above, the light emitting device 10 can include a wavelength converting member 50 on the first face 11 side. The wavelength converting member 50 is a component for converting a wavelength of a portion of the light being transmitted to another wavelength. The wavelength converting member 50 may contain a phosphor that is excited by the light being transmitted. By being equipped with the wavelength converting member 50, the light emitting device 10 having a different emission color than that of the light emitting element 20 can be obtained. For example, combining a light emitting element 20, which emits blue light, with a wavelength converting member 50, which absorbs blue light and emits yellow fluorescence, can produce a light emitting device 10 that emits white light.

The wavelength converting member 50 is preferably disposed to cover the first face 21 of the light emitting element 20 and the first face 31 of the light transmissive member 30. The light generated at the light emitting element 20 is extracted directly from the first face 21 of the light emitting element 20, or indirectly extracted from the first face 31 of the light transmissive member 30 as it exits the side faces 23 of the light emitting element 20 and passes through the light transmissive member 30. Accordingly, disposing the wavelength converting member 50 so as to cover the first face 21 of the light emitting element 20 and the first face 31 of the light transmissive member 30 allows most portion of the light generated at the light emitting element 20 to pass through the wavelength converting member 50. In other words, emission color irregularities of the light emitting device 10 can be suppressed because the light that does not pass through the wavelength converting member 50 is reduced.

First Embodiment of Manufacturing Process

A first embodiment of manufacturing method for the light emitting device 10 according to Embodiment 1 will be explained next with reference to FIG. 5.

Step 1-1. Securing of Light Emitting Element 20

Figure 5A:
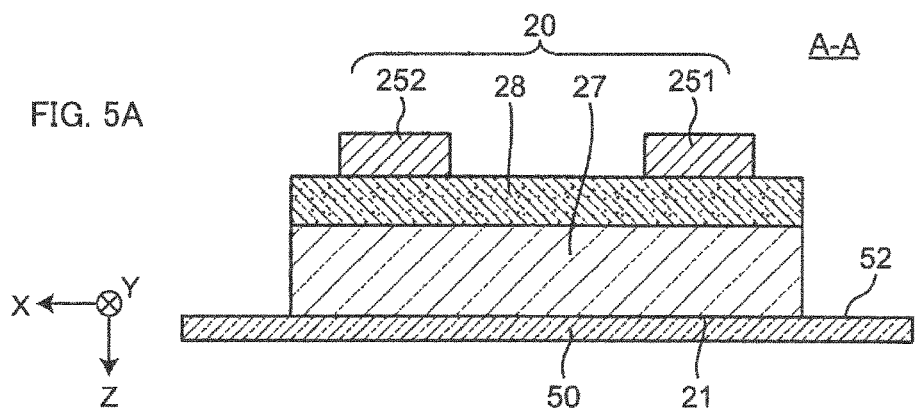
FIGS. 5A to 5C are schematic sectional views explaining a first embodiment of method for manufacturing the light emitting device according to Embodiment 1.

The light emitting element 20 is placed on the wavelength converting member 50 (FIG. 5A). At this time, the light emitting element 20 is placed so that its first face 21 opposes the second face 52 of the wavelength converting member 50.

The light emitting element 20 can be secured on the wavelength converting member 50 using a light transmissive adhesive or the like. In lieu of an adhesive, the light emitting element 20 may be secured to the wavelength converting member 50 using the light transmissive member 30 which will be subsequently formed. In the cases where the wavelength converting member 50 itself has adhesive properties, for example semi-cured state or the like, the light emitting element may be secured without using any adhesive.

Step 1-2. Formation of Light Transmissive Member 30

Figure 5B:
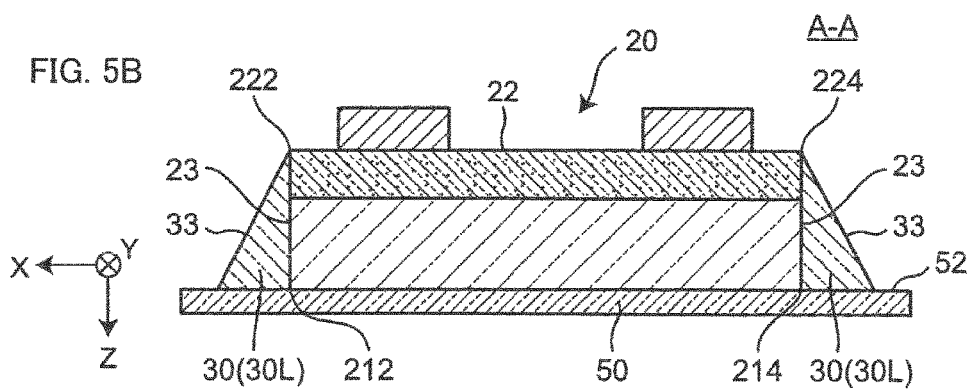

A light transmissive member 30 is formed so as to cover portions of the side faces 23 of the light emitting element 20 and the region of the second face 52 of the wavelength converting member 50 in the vicinity of the light emitting element 20 (FIG. 5B). In the cases where the light transmissive member 30 is made of a light transmissive resin material, the liquid resin material 30L, which is the raw material for the light transmissive member 30, is applied along the borders between the first edges of the light emitting element 20 (reference numerals 212 and 214 in FIG. 5B) and the wavelength converting member 50 using a dispenser, or the like. The liquid resin material 30L spreads over the wavelength converting member 50 as well as creeping up the side faces 23 of the light emitting element 20 due to surface tension. Subsequently, the liquid resin material 30L is cured by heating or the like to obtain the light transmissive member 30.

The creeping distance of the liquid resin material 30L on the light emitting element 20 can be controlled by adjusting the viscosity and the amount of the liquid resin material 30L applied. For example, in the case of the light transmissive member 30 shown in FIG. 3, the liquid resin material 30L creeps up the side faces 23 of the light emitting element 20 to come into contact with the second edges 221, 222, 223, and 224 in portions. The liquid resin material 30L creeps up the third edges 231, 232, 233, and 234 partway, but does not reach the corners 241, 242, 243, and 244 of the light emitting element 20. By adjusting the viscosity and the amount of the liquid resin material 30L so as to result in the shape shown in FIG. 3, the corners 241, 242, 243, and 244 of the light emitting element 20 can be exposed and not covered by the light transmissive member 30. The viscosity of the liquid resin material 30L can be adjusted by adding a filler or the like.

Forming the light transmissive member 30 from the liquid resin material 30L can make the exterior 33 of the light transmissive member 30 to be outwardly oblique in z direction (i.e., in the direction moving away from the side faces 23 of the light emitting element 20) due to surface tension (FIG. 5B).

Step 1-3. Formation of Covering Member 40

A covering member 40 is disposed to cover the exterior 33 of the light transmissive member 30, and the portion of the second face 52 of the wavelength converting member 50 not covered by the light transmissive member 30 (i.e., the exposed portion of the second face 52). Moreover, the covering member 40 may also cover the portion of the second face 22 of the light emitting element 20 not covered by the electrodes 251 and 252 (i.e., the exposed portion of the second face 22). At this time, it is preferable to adjust the thickness (i.e., the dimension in z direction) of the covering member 40 so that one portion of each of the electrodes 251 and 252 (for example, the surfaces 251s and 252s of the electrodes 251 and 252) is not covered by the covering member 40. In other words, using the second face 52 of the wavelength converting member 50 as a reference, the height of the second face 42 of the covering member 40 from may be set to the height of the surfaces 251s and 252s of the electrodes 251 and 252, or lower.

Figure 5C:
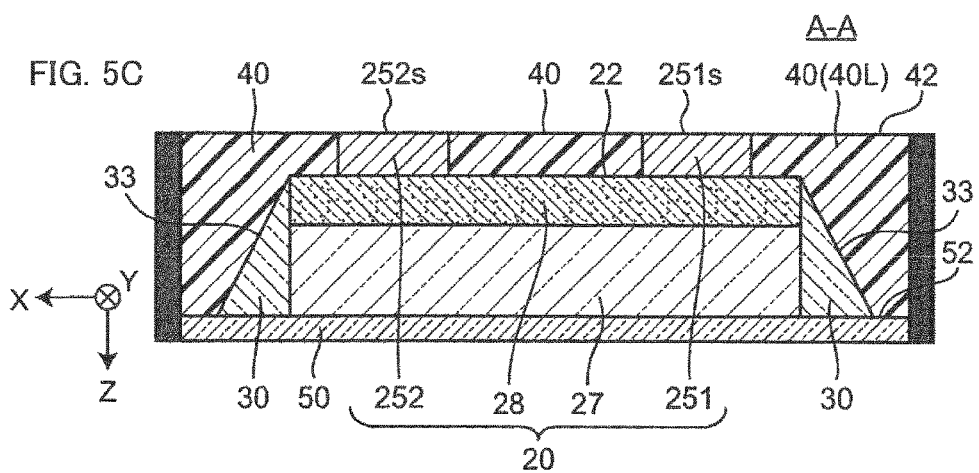

In the cases where the covering member 40 is formed from a resin material, for example, a mold is placed to enclose the light emitting element 20 and the light transmissive member 30, followed by pouring a liquid resin material 40L, which is the raw material for the covering member 40, into the mold. At this time, the wavelength converting member 50 can be used as the bottom of the mold by fitting the mold along the perimeter of the wavelength converting member 50 as shown in FIG. 5C. Subsequently, the liquid resin material 40L is cured by heating, or the like, to obtain the covering member 40. By removing the mold, the light emitting device 10 as shown in FIGS. 1, 2, and 4 can be obtained. Alternatively, the covering member 40 may be formed by spray coating, compression molding, or various other methods. Alternatively, after forming the covering member so as to bury the electrodes 251 and 252, the electrodes 251 and 252 may be exposed by removing the covering member 40 only, or the covering member 40 and a portion of the electrodes 251 and 252.

Second Embodiment of Manufacturing Process

A second embodiment of manufacturing process for the light emitting device 10 according to Embodiment 1 will be explained with reference to FIGS. 6 to 10. Plural light emitting devices 10 can be simultaneously produced by the second manufacturing method.

Step 2-1. Securing of Light Emitting Elements 20

Figure 6A:
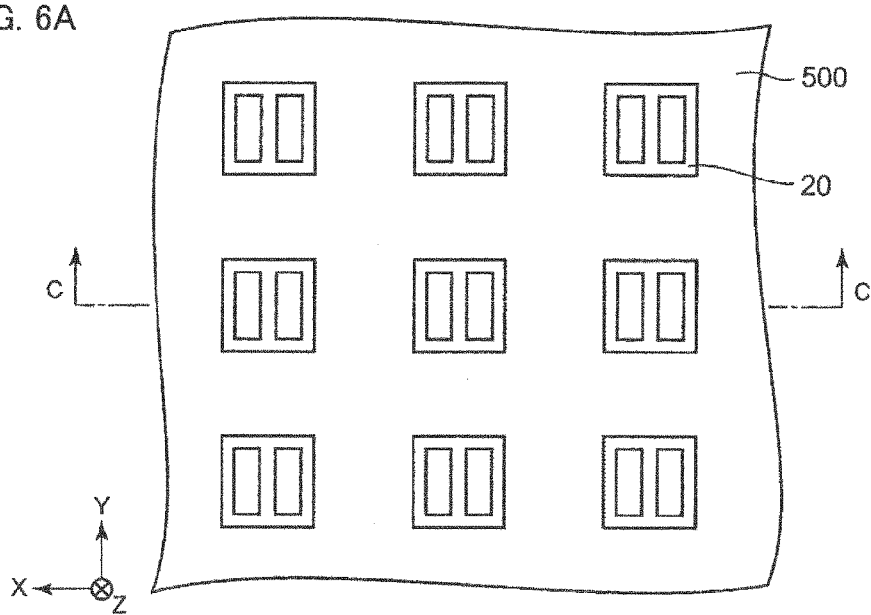
FIGS. 6A and 6B are schematic plan views explaining a second embodiment of method for manufacturing the light emitting device according to Embodiment 1.
Figure 9A:
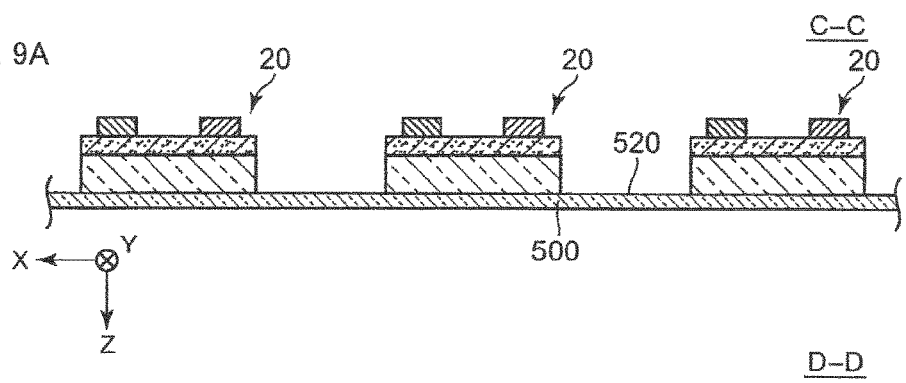
FIG. 9A is a schematic sectional view along line C-C indicated in FIG. 6A.

Light emitting elements 20 are placed on the second face 520 of a wavelength converting sheet 500 (FIGS. 6A and 9A). The wavelength converting sheet 500 will become wavelength converting members 50 once the light emitting devices 10 are separated. At this time, using a wavelength converting sheet 500 having relatively large area, plural light emitting elements 20 can be placed on a single wavelength converting sheet 500. The light emitting elements 20 are arranged at prescribed intervals. When the spacing between adjacent light emitting elements 20 is too wide, the number of light emitting devices 10 that can be produced at one time will decrease, then mass production efficiency for the light emitting devices 10 will reduce. It is thus preferable to place the light emitting elements 20 at appropriate intervals. The light emitting elements 20 are secured at prescribed positions of the wavelength converting sheet 500 by the same securing methods as those explained in step 1-1 in the first manufacturing method.

Step 2-2. Formation of Light Transmissive Members 30

Figure 6B:
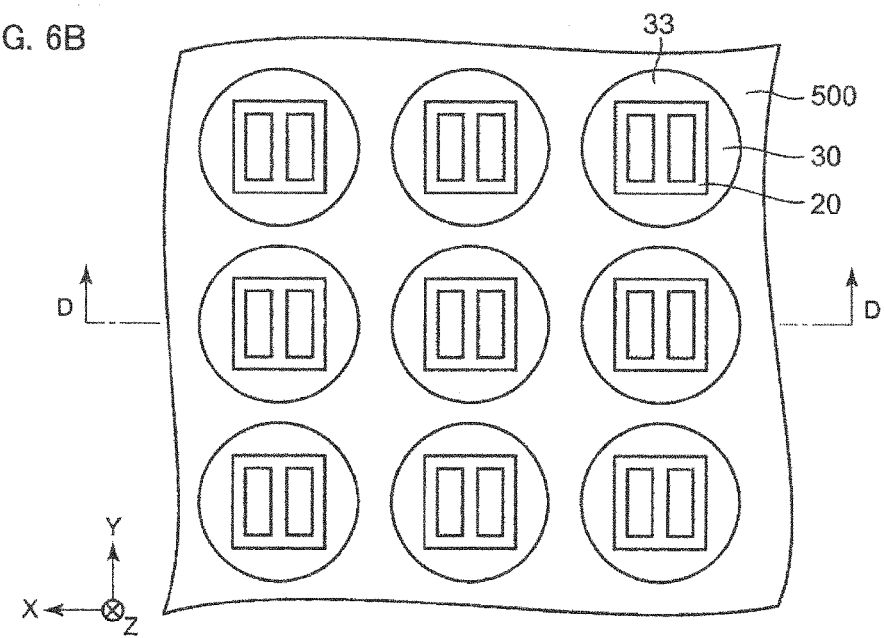
Figure 9B:
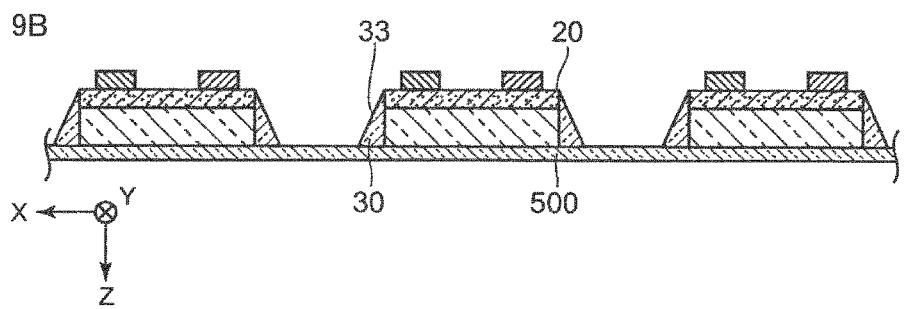
FIG. 9B is a schematic sectional view along line D-D indicated in FIG. 6B.

A light transmissive member 30 is formed in the periphery of each light emitting element 20 in similar manner to in Step 1-2 of the first manufacturing method as shown in FIGS. 6B and 9B. The light transmissive members 30 are formed so that the light transmissive member 30 formed in the periphery of one light emitting element 20 does not come into contact with the light transmissive member 30 formed in the periphery of any adjacent light emitting element 20.

Step 2-3. Formation of Covering Member 400

Figure 7A:
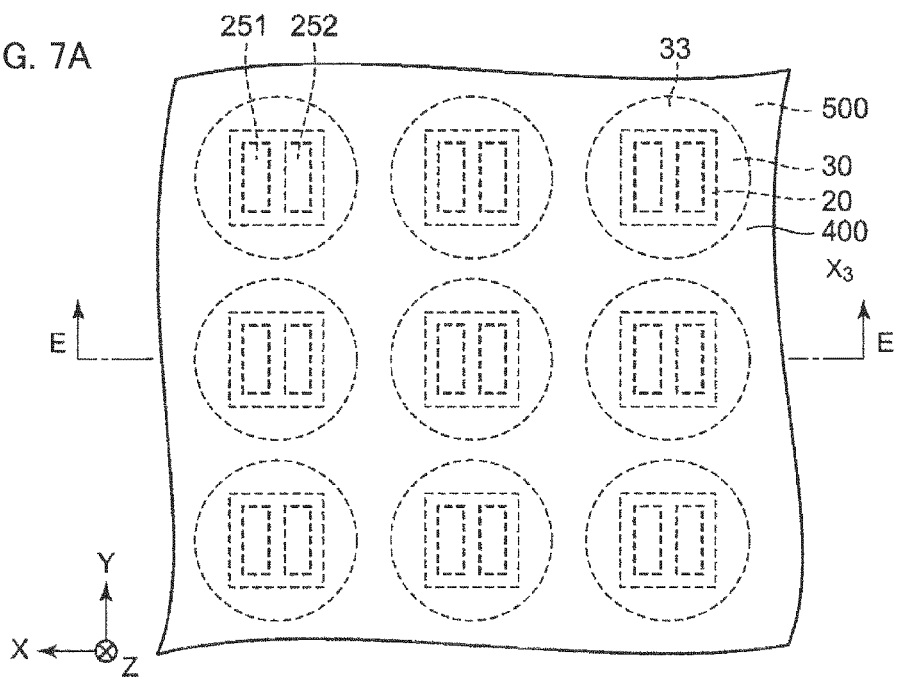
FIGS. 7A and 7B are schematic plan views explaining the second embodiment of method for manufacturing the light emitting device according to Embodiment 1.
Figure 9C:
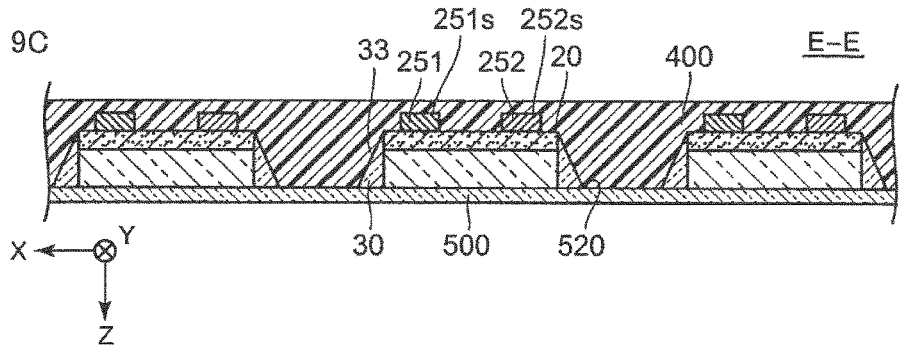
FIG. 9C is a schematic sectional view along line E-E indicated in FIG. 7A.

A covering member 400 is disposed to cover the exteriors 33 of the light transmissive members 30 and the second face 520 of the wavelength converting sheet 500 in similar manner to in Step 1-3 of the first manufacturing method as shown in FIGS. 7A and 9C. The covering member 400 will become the covering members 40 once the light emitting devices 10 are separated. Unlike Step 1-3, the thickness (dimension in z direction) of the covering member 400 is adjusted to also cover the surfaces 251s and 252s of the electrodes 251 and 252 of the light emitting elements 20 in Step 2-3. At this point, the plural light transmissive members 30 disposed in the peripheries of plural light emitting elements 20 secured on the wavelength converting sheet 500 are covered by one continuous covering member 400.

Figure 7B:
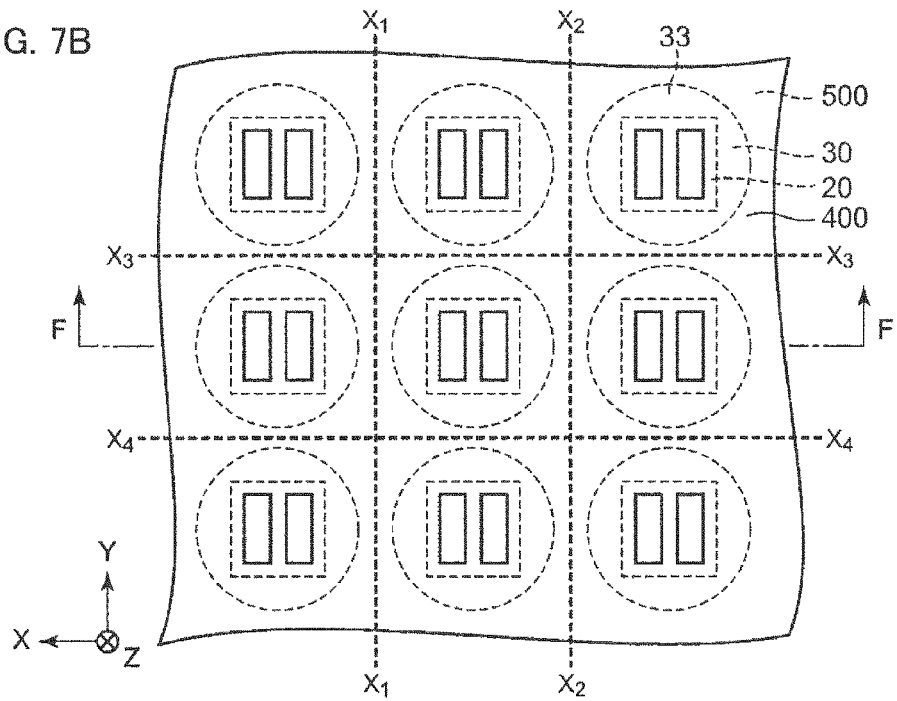
Figure 10A:
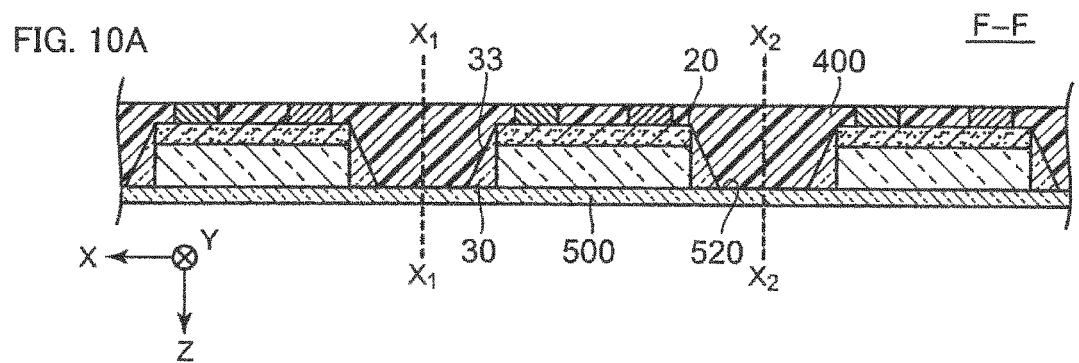
FIG. 10A is a schematic sectional view along line F-F indicated in FIG. 7B.

Subsequently, the thickness of the covering member 400 is reduced so as to expose the electrodes 251 and 252 of the light emitting elements 20 using a known process as shown in FIGS. 7B and 10A.

Step 2-4. Separation of Light Emitting Devices 10

Figure 8:
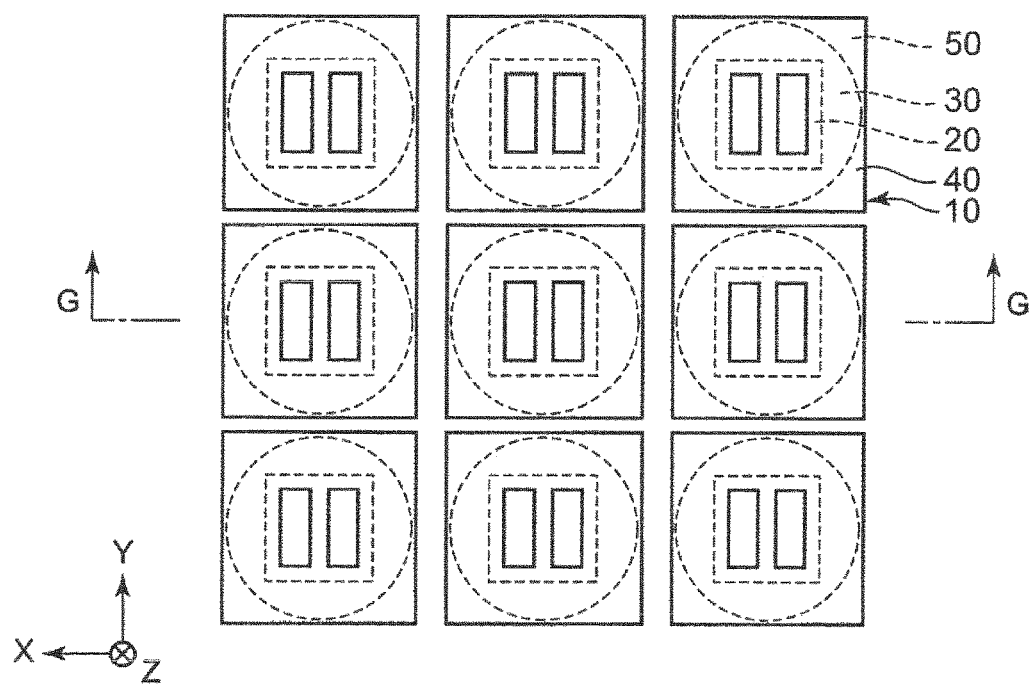
FIG. 8 is a schematic plan view explaining the second embodiment of method for manufacturing the light emitting device according to Embodiment 1.
Figure 10B:
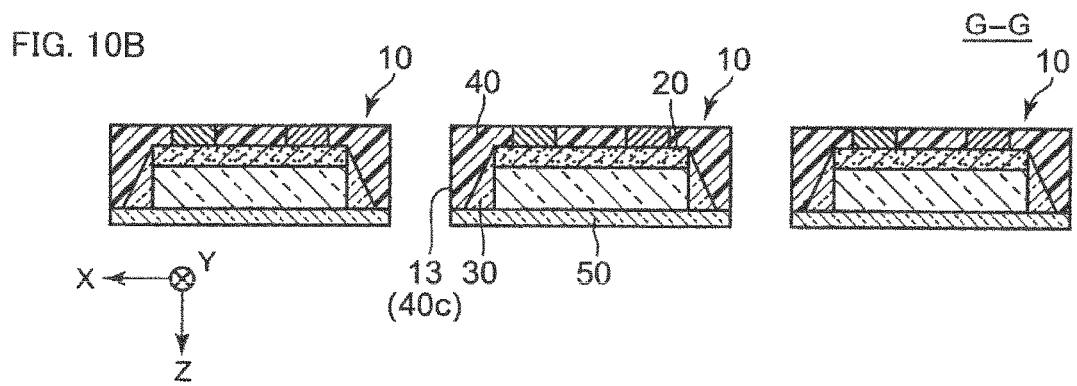
FIG. 10B is a schematic sectional view along line G-G indicated in FIG. 8.

The covering member 400 and the wavelength converting sheet 500 are cut along broken lines $X_1$, $X_2$, $X_3$, and $X_4$ running through substantially the center of adjacent light emitting elements 20 as shown in FIGS. 7B and 10A, using a dicer or the like. This separates the light emitting devices 10 into individual pieces as shown in FIGS. 8 and 10B. Plural light emitting devices 10 each having one light emitting element 20 can thus be simultaneously produced.

In the case where the light transmissive member 30 is exposed at any side face 13 of a separated light emitting device 10 (i.e., side face 40c of the covering member 40), the emitted light from the light emitting element 20 may leak transversely from the side face 13 of the light emitting device 10 through the light transmissive member 30. Accordingly, it is preferable to adjust the intervals between adjacent light emitting elements 20 and the viscosity of the light transmissive members 30 so as not to expose the light transmissive members 30 from any side face 13 of the light emitting devices 10.

Third Embodiment of Manufacturing Method

A third embodiment of manufacturing method for the light emitting device 10 according to Embodiment 1 will be explained with reference to FIGS. 11 to 12. The third process can simultaneously produce plural light emitting devices 10. The explanations of similar steps to those in the second manufacturing method will be omitted.

Step 3-1. Disposition of Light Transmissive Members 30

Figure 11A:
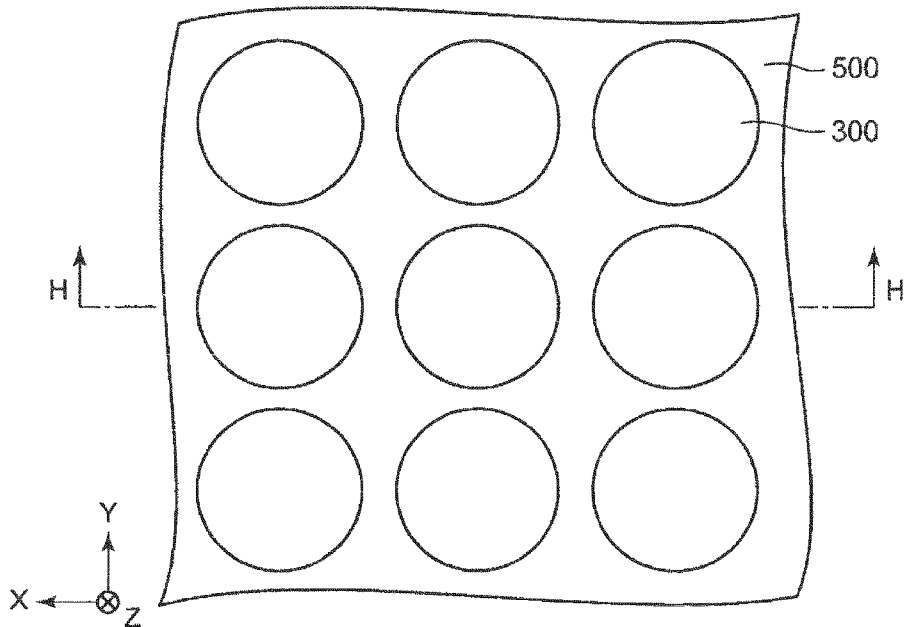
FIGS. 11A and 11B are schematic plan views explaining a third embodiment of method for manufacturing the light emitting device according to Embodiment 1.
Figure 12A:
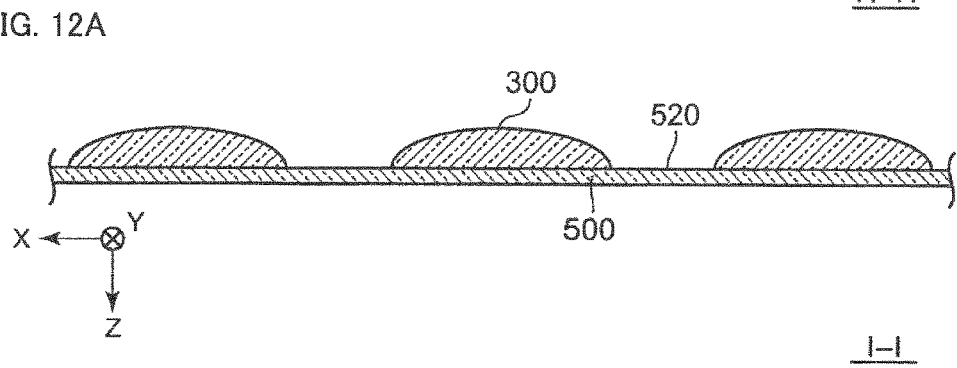
FIG. 12A is a schematic sectional view along line H-H indicated in FIG. 11A.

A liquid resin material 300 for forming the light transmissive members 30 is applied to the second face 520 of the wavelength converting sheet 500 in islands shape which as shown in FIGS. 11A and 12A. At this time, using a relatively large wavelength converting sheet 500, the liquid resin material 300 is disposed in plural islands shape. Each island of the liquid resin material 300 can have any shape in a plan view, and examples include a circle, oval, square, and rectangle. In the case where the spacing between adjacent islands of the liquid resin material 300 is too wide, the number of light emitting devices 10 that can be produced at one time may decrease, mass production efficiency for the light emitting devices 10 may be reduced. It is thus preferable to dispose the liquid resin material 300 at appropriate intervals.

Step 3-2. Securing of Light Emitting Elements 20 and Curing of Liquid Resin Material 300

Figure 11B:
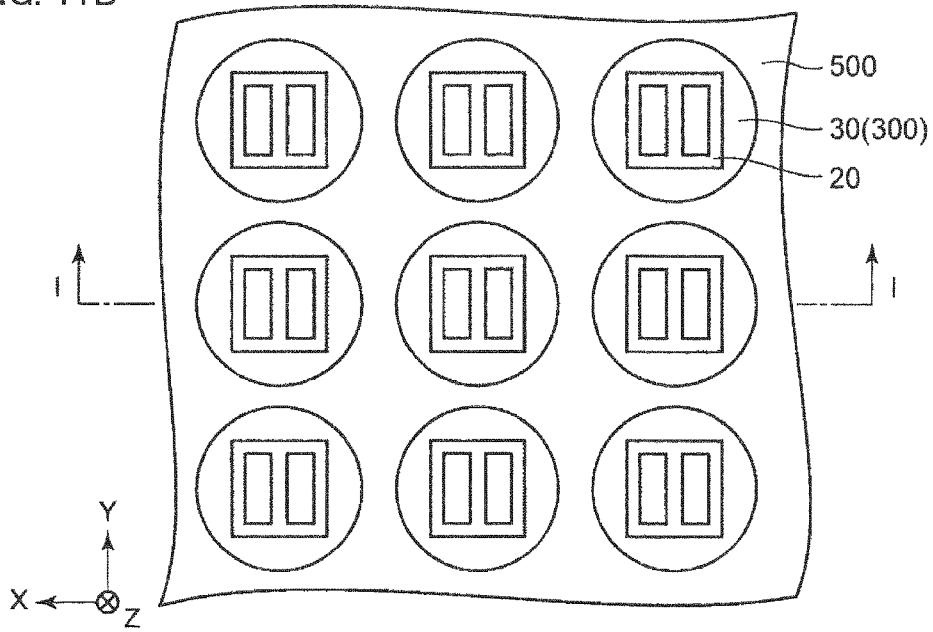
Figure 12B:
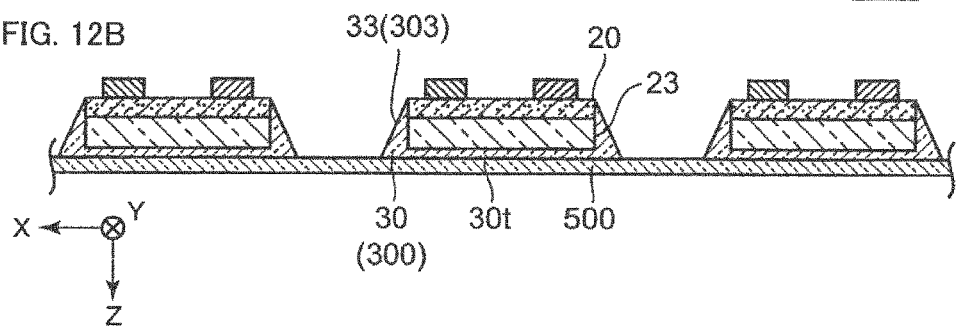
FIG. 12B is a schematic sectional view along line I-I indicated in FIG. 11B.

As shown in FIGS. 11B and 12B, light emitting elements 20 are placed on the islands of the liquid resin material 300. Placing the light emitting elements 20 on the islands of the liquid resin material 300, or pressing them down thereafter, allows the liquid resin material 300 to creep up the side faces 23 of each light emitting element 20 due to surface tension, giving the exterior 303 of the liquid resin material 300 which will later become the exteriors 33 of the light transmissive members 30 a downwardly spread shape. The liquid resin material 300 is subsequently cured to form the light transmissive members 30.

The shape of the liquid resin material 300 in a plan view may be deformed as the light emitting elements 20 are placed or pressed down thereon to each acquire the shape that is substantially consistent with the outline of the first face 31 of the light transmissive member 30 of the light emitting device 10, the finished product as shown in FIGS. 1 and 2.

In this manufacturing process, the liquid resin material 300 is present between the wavelength converting sheet 500 and the light emitting elements 20 in the form of a film. The film-form light transmissive member 30t obtained by curing the liquid resin material 300 can be also used as an adhesive between the wavelength converting sheet 500 and the light emitting elements 20. The thickness of the film-form light transmissive member 30t is preferably determined by taking into consideration adhesion and the heat dissipation of the light emitting devices 10. More specifically, the thickness of the film-form light transmissive member 30t can be set, for example, in a range between 2 and 30 μm, preferably in a range between 4 and 20 μm, more preferably in a range between 5 and 10 μm, so as to efficiently conduct the generated heat in the wavelength converting sheet 500 towards the light emitting element 20 when the light emitting device 10 is emitting light.

Subsequently, the covering member 400 is formed in similar manner to in Step 2-3, and the light emitting devices 10 are separated in similar manner to in Step 2-4 of the second production process. Plural light emitting devices 10 each having one light emitting element 20 can thus be simultaneously produced.

As discussed above, according to this manufacturing method, by placing the light emitting elements 20 on the islands of the liquid resin material 300 disposed on the wavelength converting sheet 500, the adhesion of the light emitting elements 20 and the formation of the light transmissive members 30 can be simultaneously performed. This can increase the mass production efficiency.

Fourth Embodiment of Manufacturing Method

A fourth embodiment of manufacturing method for the light emitting device 10 according to Embodiment 1 will be explained with reference to FIGS. 13 to 14. The fourth manufacturing method can simultaneously produce plural light emitting devices 10.

Step 4-1. Securing of Light Emitting Elements 20

Figure 13A:
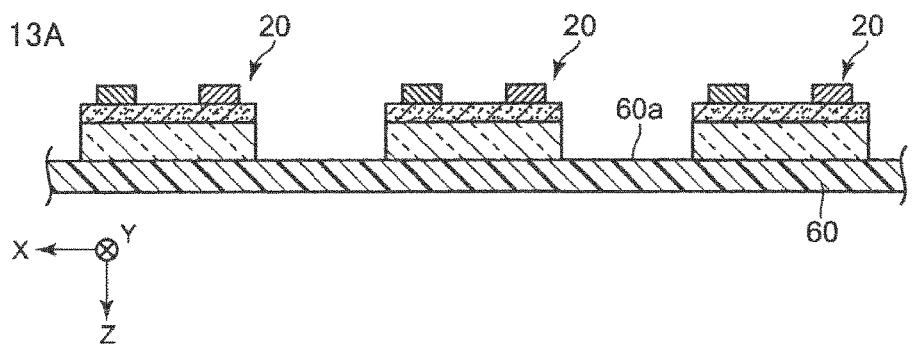
FIGS. 13A to 13C are schematic sectional views explaining the third embodiment of method for manufacturing the light emitting device according to Embodiment 1.
Figure 14A:
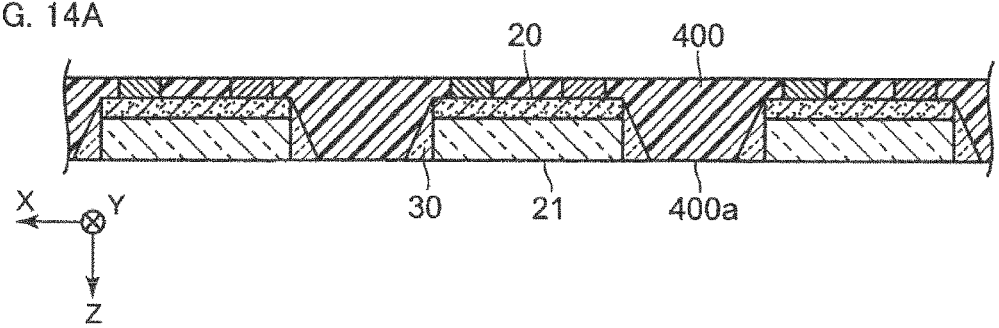
FIGS. 14A to 14C are schematic sectional views explaining a variation of the third embodiment of method for manufacturing the light emitting device according to Embodiment 1.

Light emitting elements 20 are placed on the upper face 60a of a support 60 made of a heat resistant sheet or the like as shown in FIG. 13A. At this time, using a relatively large support 60, plural light emitting elements 20 are placed on a single support 60. As in the case of Step 2-1 of the second manufacturing method, the light emitting elements 20 are placed at prescribed intervals. The light emitting elements 20 are secured at prescribed positions of the support 60 by the same securing methods as those explained in Step 1-1 of the first manufacturing method.

Step 4-2. Formation of Light Transmissive Members 30

Figure 13B:
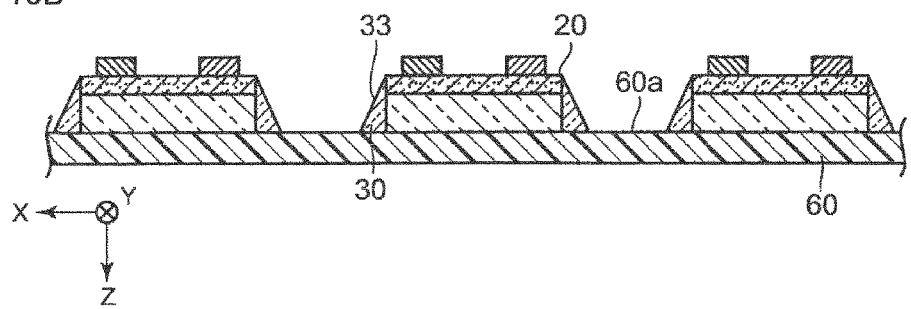

A light transmissive member 30 is formed in the periphery of each light emitting element 20 in similar manner to as in Step 1-2 of the first manufacturing method as shown in FIG. 13B. The light transmissive members 30 are formed so that the light transmissive member 30 formed in the periphery of one light emitting element 20 does not come into contact with the light transmissive member 30 formed in the periphery of any adjacent light emitting element 20.

Step 4-3. Formation of Covering Member 400

Figure 13C:
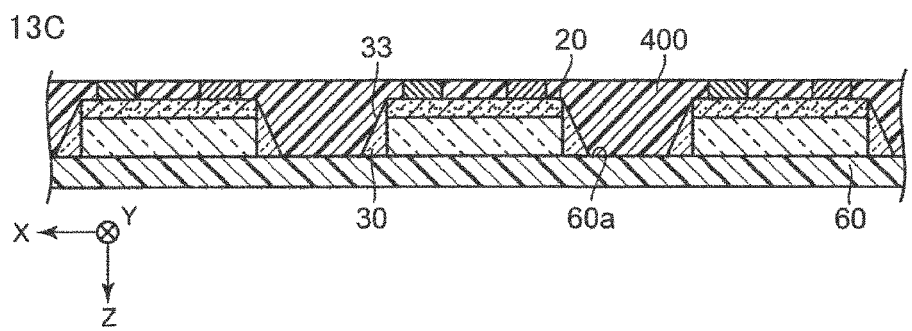

A covering member 40 is disposed to cover the exteriors 33 of the light transmissive members 30 and the upper face 60a of the support component 60 in the same manner as in Step 1-3 of the first manufacturing method as shown in FIG. 13C. The covering member 400 will become the covering members 40 once the light emitting devices 10 are separated. The plural light transmissive members 30 disposed in the peripheries of the light emitting elements 20 secured on the support 60 are covered by one continuous covering member 400.

Step 4-4. Formation of Wavelength Converting Layer 510

The first faces 21 of the light emitting elements 20 and the first face 400a of the covering member 400 (FIG. 14A) is exposed by removing (separateing) the support 60. Subsequently, a wavelength converting layer 510 is formed to cover the first faces 21 of the light emitting elements 20 and the first face 400a of the covering member 400 (hereinafter referred to as the "first faces 21 and 400a"). The wavelength converting layer 510 will become the wavelength converting members 50 once the light emitting devices 10 are separated. Examples for the methods for forming the wavelength converting layer 510 include adhering a sheet made of a phosphor-containing light transmissive resin to the first faces 21 and 400a by a hot melt process or using an adhesive, depositing a phosphor to the first faces 21 and 400a by electrophoretic deposition followed by applying a light transmissive resin to be impregnated with the phosphor; and coating the first faces 21 and 400a with a phosphor-containing light transmissive resin by potting, transfer molding, compression molding, casting, spraying, electrostatic spray coating, printing, or the like. Among these methods, spraying is preferable, and pulsed spraying which intermittently jets out the sprays is particularly preferable.

Step 4-5. Separation of Light Emitting Devices 10

Figure 14B:
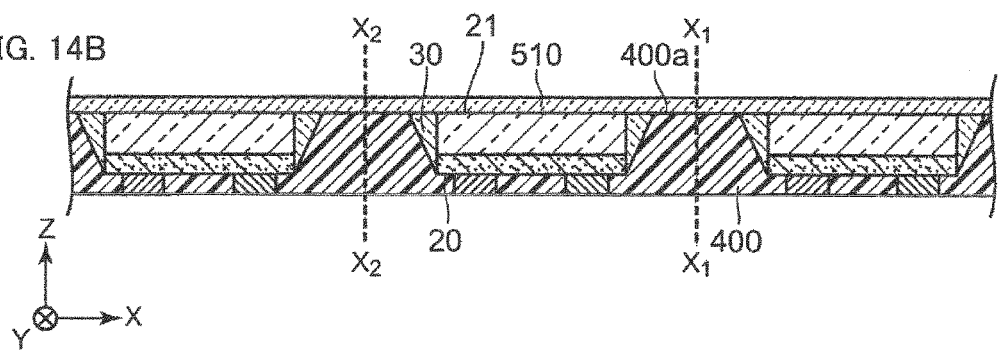
Figure 14C:
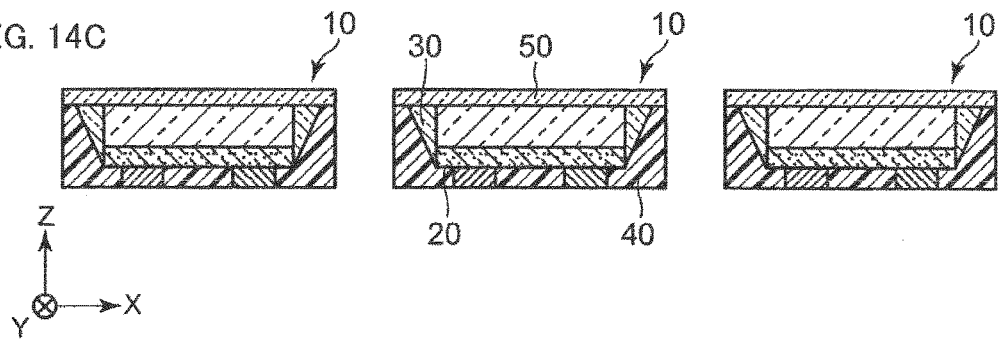

In the same manner as in Step 2-4 of the second manufacturing method, the covering member 400 and the wavelength converting layer 510 are cut along broken lines $X_1$ and $X_2$ running through the center of adjacent light emitting elements 20 using a dicer or the like (FIG. 14B). This separates the light emitting devices 10 into individual pieces (FIG. 14C). Plural light emitting devices 10 each containing one light emitting element 20 can thus be simultaneously produced.

Embodiment 2

As shown in FIG. 15, the light emitting device 15 according to this embodiment differs from the light emitting device 10 according to Embodiment 1 such that the side faces 501b of the wavelength converting member 501 are covered by the covering member 403, and the covering member 403 is of a double-layer structure. It is otherwise the same as Embodiment 1.

The light emitting device 15 according to this embodiment includes a light emitting element 20, a wavelength converting member 501 covering the first face 21 of the light emitting element 20, a light transmissive member 30 disposed on the side faces 23 of the light emitting element 20, and a covering member 403 covering the exterior 33 of the light transmissive member 30. In this embodiment, the covering member 403 includes a first covering member 401 that covers the side faces 501b of the wavelength converting member 501 and a second covering member 402 that covers the exterior 33 of the light transmissive member 30.

Covering the side faces 501b of the wavelength converting member 501 with the covering member 403 (i.e., the first covering member 401) can reduce the light emitted from the light emitting element 20 from propagating inside the wavelength converting member 501 and transversely leaking from the side faces 501b. With this arrangement, most portion of the light emitted from the light emitting device 15 can be extracted from the first face (upper face) 16 which functions as the emission face of the light emitting device 15. Since the light from the light emitting device 15 is substantially ejected in z direction, the light directionality of the light emitting device 15 can be enhanced.

A manufacturing method for the light emitting device 15 will be explained next with reference to FIGS. 16 to 17.

Step A. Formation of Wavelength Converting Member 501

Figure 15A:
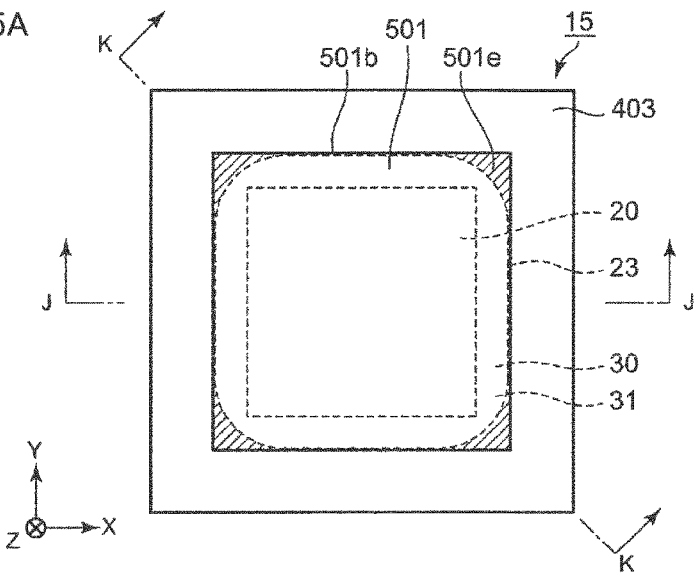
FIG. 15A is a schematic plan view of the light emitting device according to Embodiment 2.
Figure 16A:
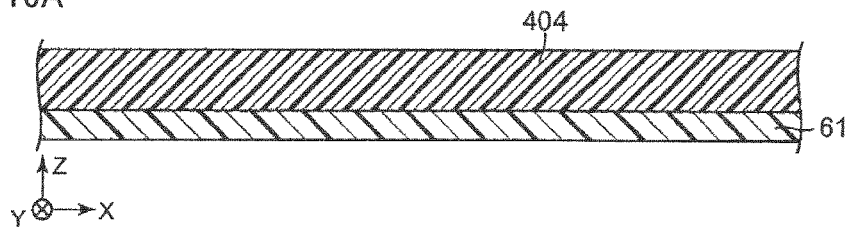
FIGS. 16A to 16E are schematic sectional views explaining a method for manufacturing the light emitting device according to Embodiment 2.
Figure 16B:
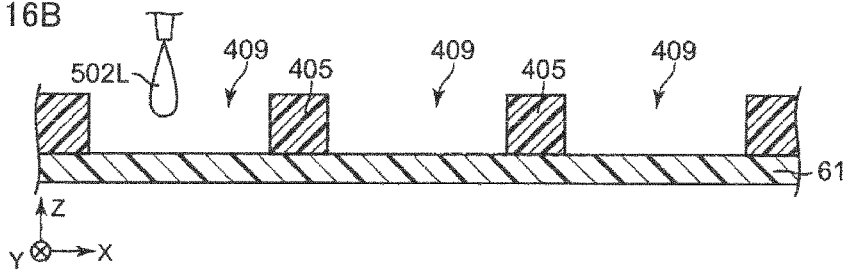

On the first support 61 made of a heat resistant sheet, or the like, a covering member material layer 404 for forming the first covering member 401 is formed as shown in FIG. 16A. Then, frames 405 are obtained by creating holes through the covering member material layer 404 as shown in FIG. 16B. The dimensions and shape of the inner face of each hole 409 of the frame 405 when viewed from z direction are identical with the dimensions and shape of the outline of the wavelength converting member 501 in the plan view of the light emitting device 15 shown in FIG. 15A. The holes 409 are created by penetrating the covering member material layer 404 without penetrating the first support 61.

Figure 15B:
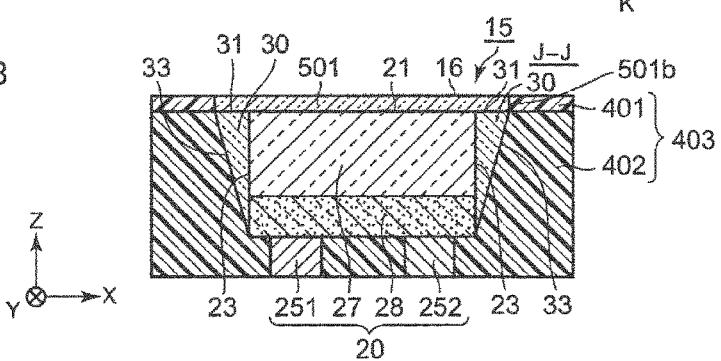
FIG. 15B is a schematic sectional view along line J-J indicated in FIG. 15A
Figure 16C:
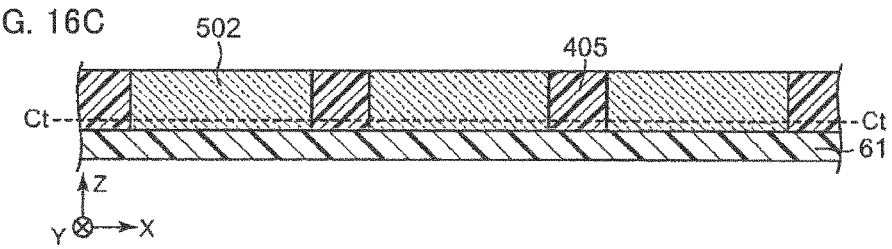
Figure 16D:
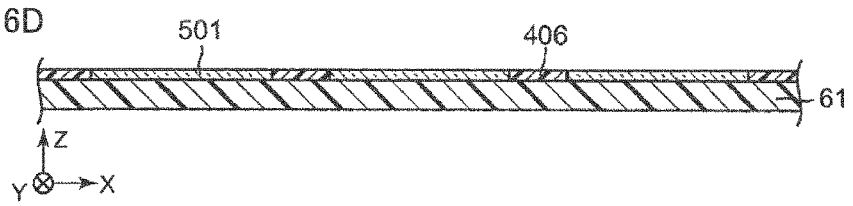
Figure 16E:
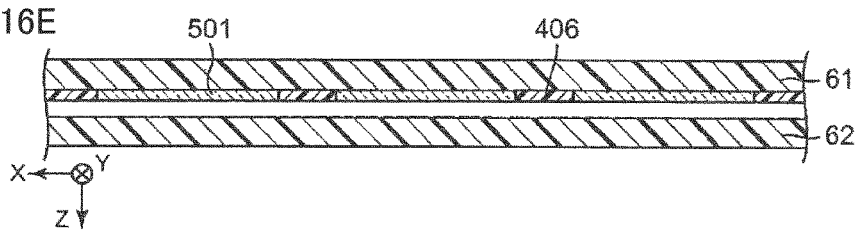

A phosphor-containing light transmissive resin that is a liquid resin material before curing 502L is applied to each hole 409 by potting as shown in FIG. 16B. Subsequently, the phosphor-containing components 502 are formed by curing the light transmissive resin 502L by heating as shown in FIG. 16C. The "upper portions of the phosphor-containing components 502" and the "upper portions of the frames 405" located above line Ct-Ct (broken line) indicated in FIG. 16C are removed by a cutting or grinding operation. This forms a sheet component which includes the lower portions of the phosphor-containing components 502 (wavelength converting members 501) and the lower portions of the frames 405 (hereinafter referred to as the "thinned frames 406") as shown in FIG. 16D). The thinned frames 406 will later become the first covering member 401 shown in FIG. 15B. Then, the sheet component (wavelength converting members 501 and thinned frames 406) is transferred to the second support 62 made of a heat resistant sheet or the like as shown in FIG. 16E. Alternatively, transferring of the sheet component may be omitted.

Step B. Securing of Light Emitting Elements 20

Figure 17A:
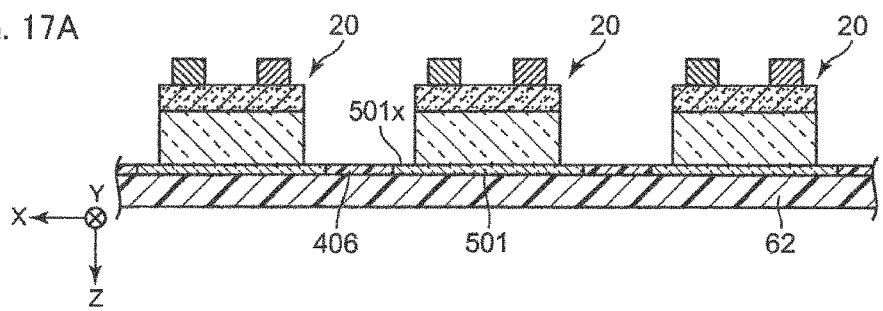
FIGS. 17A to 17D are schematic sectional views explaining the method for manufacturing the light emitting device according to Embodiment 2.

On each exposed face 501x of the wavelength converting member 501, a light emitting element 20 is secured as shown in FIG. 17A. The securing methods for the light emitting elements 20 are similar to those explained in Step 1-1 in Embodiment 1.

Step C. Formation of Light Transmissive Members 30

Figure 17B:
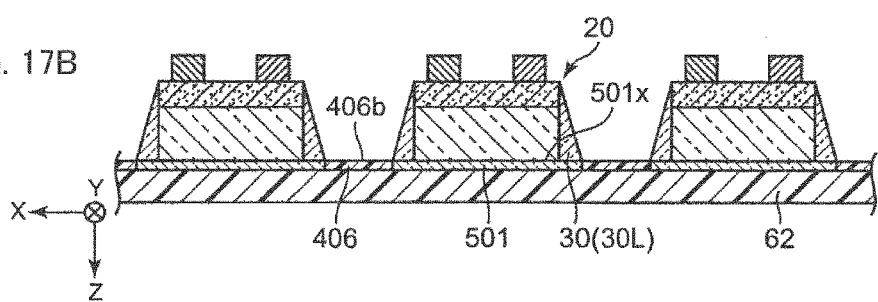

A liquid resin material 30L which is the raw material for the light transmissive member 30 is applied in the periphery of each light emitting element 20 in similar manner to in Step 1-2 of Embodiment 1 as shown in FIG. 17B. The light transmissive member 30 is obtained by curing the liquid resin material 30L by heating or the like. The liquid resin material 30L spreads over the exposed face 501x of the wavelength converting member 501, but upon reaching the borders with the thinned frames 406, it would not readily spread therebeyond due to the pinning effect. For this reason, in the light emitting device 15 according to this embodiment, the shape of the light transmissive member 30 can be easily controlled. As shown in FIG. 15A, the light transmissive member 30 does not reach the four corner portions 501e of the wavelength converting member 501 (the hatched portions). Accordingly, the four corner portions 501e are exposed by not being covered by the light transmissive member 30.

Step D. Formation of Covering Member 407

Figure 15C:
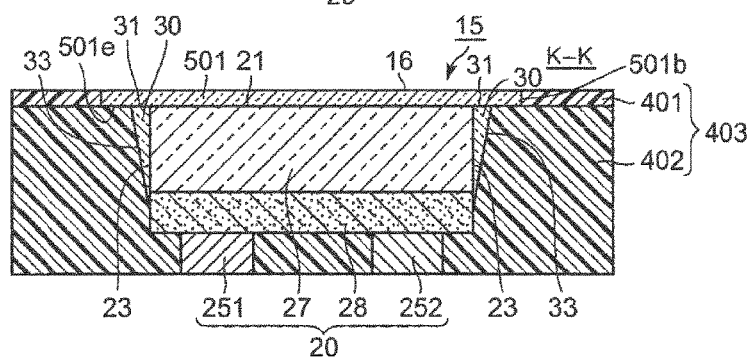
FIG. 15C is a schematic sectional view along line K-K indicated in FIG. 15A.
Figure 17C:
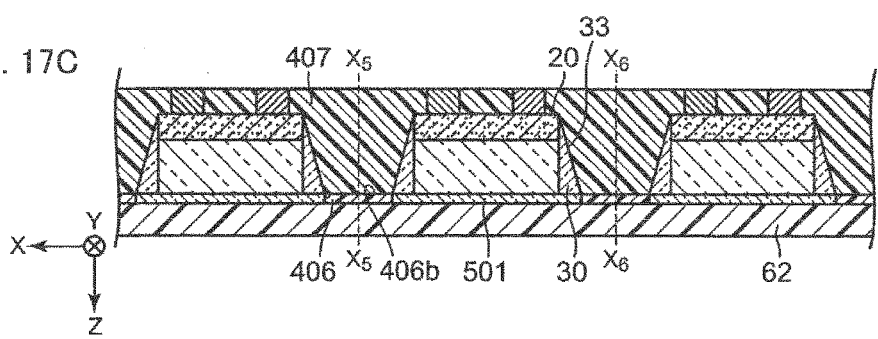
Figure 17D:
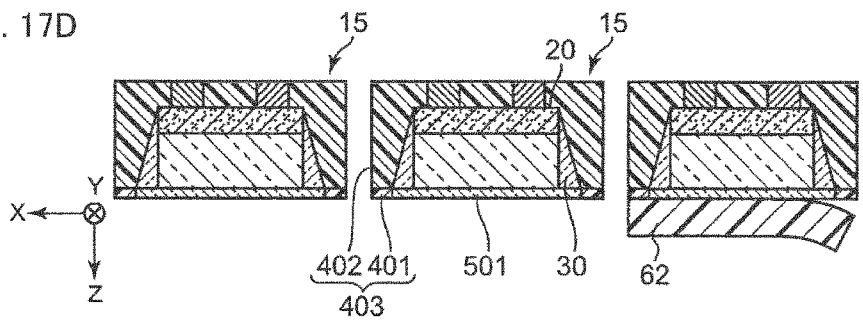

A covering member 407 is disposed to cover the exteriors 33 of the light transmissive members 30, the four corner portions of the wavelength converting members 501 (reference numeral 501e in FIG. 15A), and the second faces 406b of the thinned frames 406 surrounding the wavelength converting members 501 in the same manner as in Step 1-3 of Embodiment 1 (FIG. 17C). The covering member 407 will become second covering member 402 once the light emitting devices 15 are separated. The plural light transmissive members 30 disposed in the peripheries of the light emitting elements 20 are covered by one continuous covering member 407. As shown in FIG. 15A, the wavelength converting member 501 is covered by the light transmissive member 30 except for the four corner portions 501e. Thus, the wavelength converting member 501 is covered by the covering member 407 only at the four corner portions 501e which are not covered by the light transmissive member 30 as shown in FIG. 15C.

Step E. Separation of Light Emitting Devices 15

The covering member 407, the thinned frames 406, and the second support 62 are cut along broken lines $X_5$ and $X_6$ running through the center of adjacent light emitting elements 20 using a dicer or the like. Lastly, the light emitting devices 15 are obtained by removing (separating) the second support 62. Alternatively, the second support 62 may be removed before the cutting operation, followed by cutting the covering member 407 and the thinned frames 406.

Embodiment 3

In this embodiment, the shapes of the electrodes of the light emitting element included in the light emitting device differ from the shapes of the electrodes 251 and 252 of light emitting element 20 according to Embodiment 1. The structure of the light emitting device is otherwise similar to that of Embodiment 1.

Figure 18:
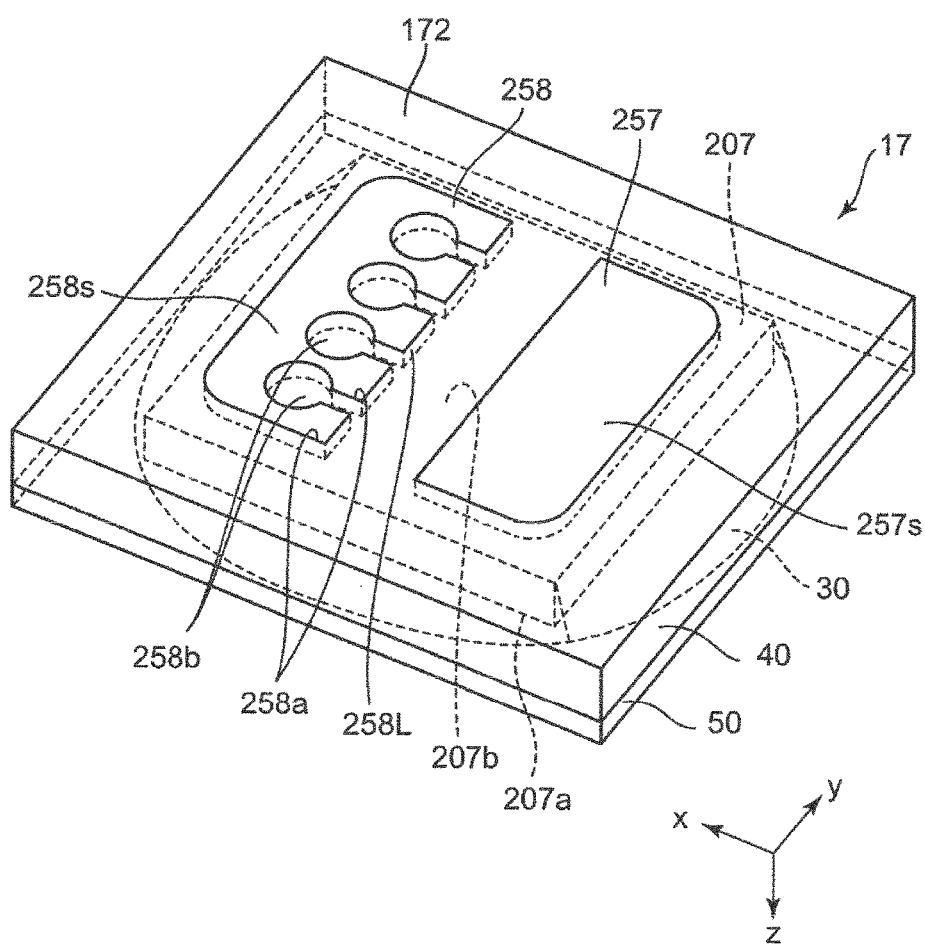
FIG. 18 is a schematic perspective view of the light emitting device according to Embodiment 3.

FIG. 18 is a perspective view of the light emitting device 17 according to this embodiment. The light emitting element 207 included in the light emitting device 17 has a semiconductor stack 28 and a pair of electrodes 257 and 258. At the second face (lower face) 172 of the light emitting device 17, surfaces 257s and 258s of the pair of electrodes 257 and 258 are exposed by not being covered by the covering member 40.

In this embodiment, the shape of the surface 257s of the first electrode 257 and the surface 258s of the second electrode 258 are different. The shape of the surface 257s of the first electrode 257 is substantially rectangle extending in one direction (y direction). The shape of the surface 258s of the second electrode 258 is comb-shaped having alternately provided protrusions 258a and recesses 258b along a side 258L that opposes the first electrode 257. The recesses 258b are filled with the covering member 40. This can enhance the adhesion between the light emitting element 207 and the covering member 40.

The protrusions 258a and the recesses 258b can be any shape. For example, in FIG. 18, the shape of each recess 258b includes an oblong portion extending in x direction from t side 258L, and a circular portion at the end of the oblong portion. In the case where two or more recesses 258b are provided, they may all have the same shape as shown in FIG. 18, or some or all may have different shapes. In the case where three or more recesses 258b are provided, the intervals between adjacent recesses 258b may all be equal as shown in FIG. 18, or different.

Figure 19:
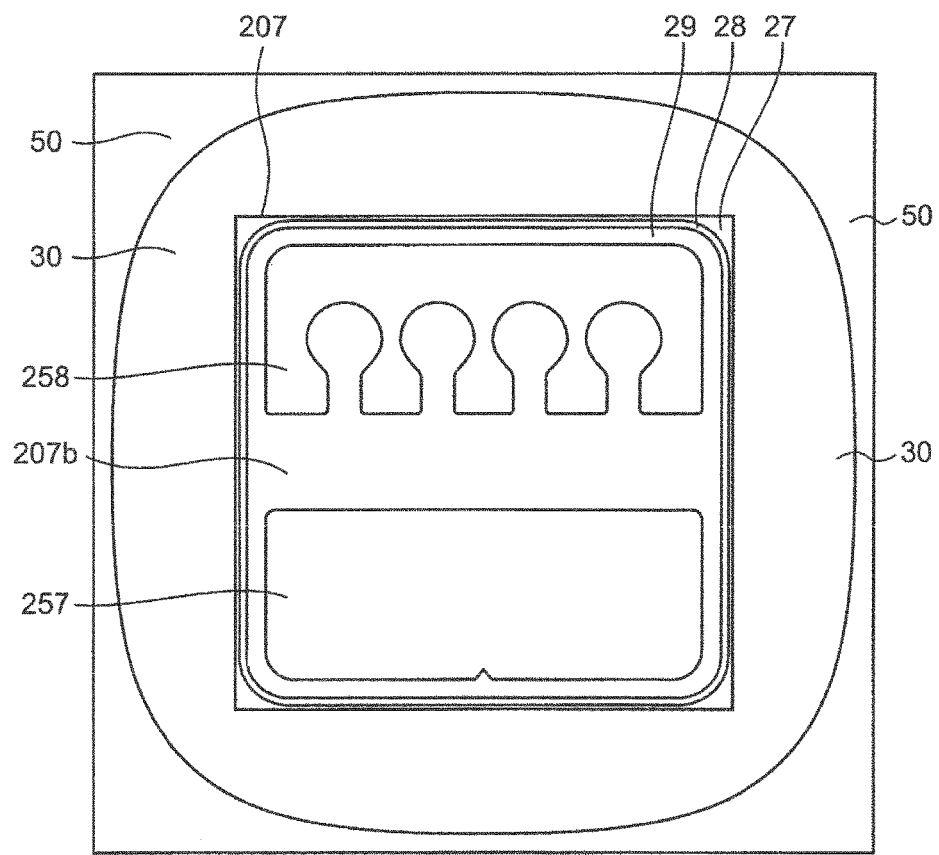
FIG. 19 is a schematic plan view of the light emitting device according to Embodiment 3 showing the light transmissive member in an exposed state by omitting the covering member.

FIG. 19 is a plan view of the light emitting device 17 in a state in which the covering member 40 shown in FIG. 18 is omitted, and FIG. 20 is a perspective view of the light emitting device 17 in a state in which the covering member 40 is omitted. As shown in FIGS. 19 and 20, the light emitting element 207 can include a reflective film 29 on the second face 207b side, more specifically on the second semiconductor layer 283 side of the semiconductor stack 28 of the light emitting element 207 as shown in FIGS. 20 and 3. The reflective film 29 can be formed, for example, using a high reflectance metal, such as Ag and Al, or a dielectric multilayer film, or the like. By providing the reflective film 29, the light traveling towards the second face 207b can be reflected towards the first face 207a.

As shown in FIG. 19, the light emitting element 207 might not have the semiconductor stack 28 or the reflective film 29 formed at the corner portions of the light transmittive substrate 27 for reasons attributable to production steps. It is desirable to cover the corner portions, which have no reflective film 29, with the covering member 40. Reflecting the light traveling towards the corners of the light transmittive substrate 27 at the interface between the light transmittive substrate 27 and the covering member 40 can contribute to increasing the light extraction efficiency of the light emitting device 17.

Appropriate materials for each component of the light emitting devices 10 according to Embodiments 1-3 will be explained below.

Light Emitting Element 20, 207

For the light emitting element 20 or 207, a semiconductor light emitting element, such as a light emitting diode, can be used. The semiconductor light emitting element may include a light transmittive substrate 27 and a semiconductor stack 28 formed thereon.

Light Transmittive Substrate 27

For the light transmittive substrate 27 of the light emitting element 20 or 207, for example, a light transmissive insulating material, such as sapphire ($Al_2O_3$) or spinel ($MgAl_2O_4$), or a semiconductor material that allows the emitted light from the semiconductor stack 28 to transmit therethrough (e.g., a nitride-based semiconductor material) can be used.

Semiconductor Stack 28

The semiconductor stack 28 includes plural semiconductor layers. As an example, the semiconductor stack 28 can include three semiconductor layers comprising a first conductive type semiconductor layer (e.g., n-type semiconductor layer) 281, an emission layer (active layer) 282, and a second conductive type semiconductor layer (e.g., p-type semiconductor layer) 283 as shown in FIG. 3. The semiconductor layers can be formed using, for example, semiconductor materials such as group III-V compound semiconductors, group II-VI compound semiconductors, or the like. More specifically, a nitride-based semiconductor material, such as an $In_XAl_YGa_{1-X-Y}N$ ($0 \leq X$, $0 \leq Y$, $X+Y \leq 1$) or the like (e.g., InN, AlN, GaN, InGaN, AlGaN, InGaAlN, or the like) can be used.

Electrodes 251, 252, 257, 258

For the electrodes 251, 252, 257, and 258 of the light emitting element 20 and 207, a good conductor of electricity can be used, and for example, a metal such as Cu is suitable.

Light Transmissive Member 30

The light transmissive member 30 can be formed from a light transmissive material, such as a light transmissive resin, glass, or the like. For the light transmissive resin, thermosetting light transmissive resins, such as silicone resins, silicone modified resins, epoxy resins, phenol resins, and the like are preferable. Since the light transmissive member 30 is in contact with the side faces 23 of the light emitting element 20, it is readily affected by the heat generated at the light emitting element 20 when turned on.

Thermosetting resins are highly heat resistant generally, and thus are suited for the light transmissive member 30. The light transmissive member 30 preferably has high light transmittance. For this reason, it is preferable not to add any additives that reflect, absorb, or scatter the light to the light transmissive member 30. However, there are instances where an addition of an additive to the light transmissive member 30 is preferable in order to impart desirable properties. For example, various fillers may be added in order to adjust the refractive index of the light transmissive member 30, or the viscosity of the light transmissive member before curing (liquid resin material 300).

In a plan view of the light emitting device 10, the outline of the first face 31 of the light transmissive member 30 is larger than at least the outline of the second face 22 of the light emitting element 20. The outline of the first face 31 of the light transmissive member 30 can be shaped in various ways, and can have for example, a circular shape as shown in FIG. 21A, a quadrangle with rounded corners as shown in FIG. 15A, oval, square, rectangle, or the like.

Figure 21A:
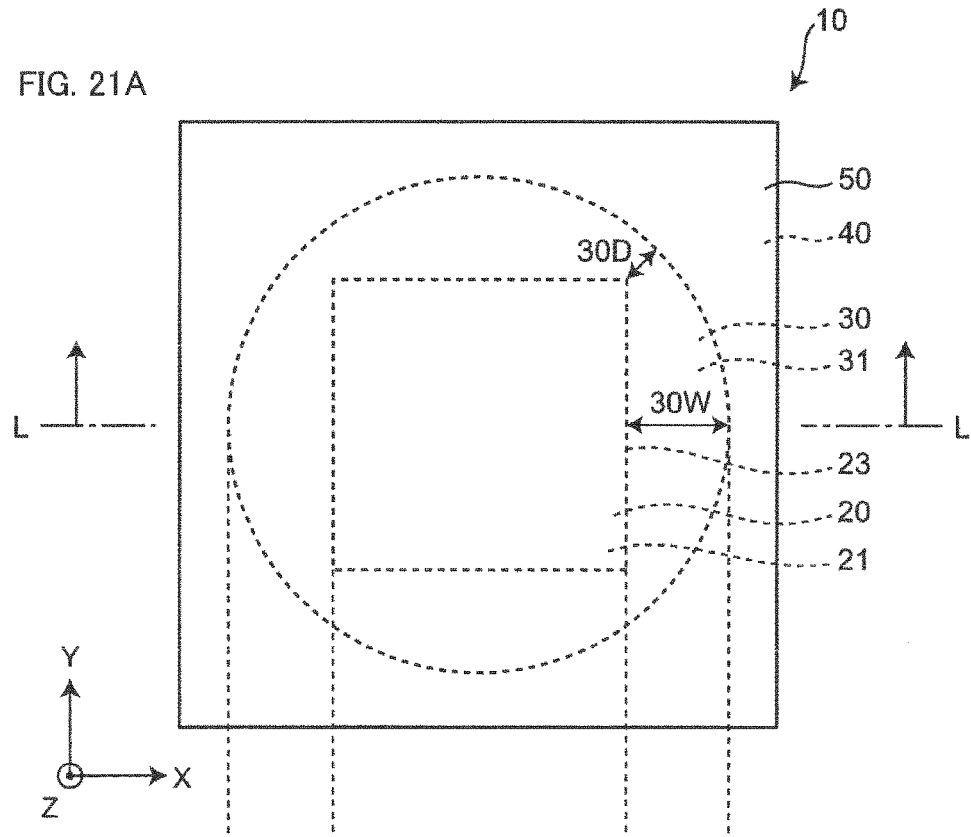
FIG. 21A is a schematic plan view of the light emitting device.
Figure 21B:
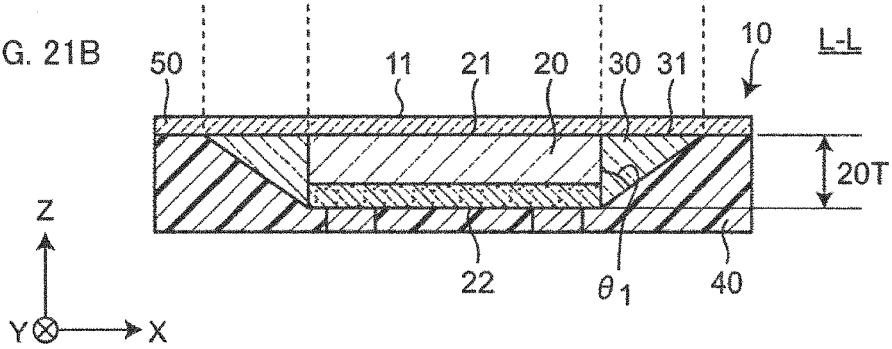
FIG. 21B is a schematic sectional view along line L-L indicated in FIG. 21A.

Particularly, as shown in FIG. 21A, with respect to the dimensions of the first face 31 of the light transmissive member 30 in a plan view (i.e., distances between the outline of the first face 21 of the light emitting element 20 and the outline of the first face 31 of the light transmissive member 30), it is preferable to meet the condition, the dimension 30D<the dimension 30W, when comparing the dimension 30D along the diagonal line of the light emitting element 20 with the dimension 30W along the line perpendicular to one side face 23 of the light emitting element 20 at the center of that side. In order to satisfy this dimensional condition, the shape of the first face 31 of the light transmissive member 30 is preferably a circle, an oval, or a quadrangle with rounded corners.

The outline shape of the first face 31 of the light transmissive member 30 may be determined based on other conditions. For example, when the light emitting device 10 is used in combination with an optical lens (secondary lens), the outline of the first face 31 is preferably circular, which also gives a shape close to a circle to the emission from the light emitting device 10 thereby allowing the optical lens to easily condense the light. On the other hand, if a reduction in the size of the light emitting device 10 is desired, the outline of the first face 31 is preferably a quadrangle with rounded corners, which can reduce the dimension 30W thereby reducing the dimensions of the upper face 11 of the light emitting device 10.

In general, considering both the ease of condensing by an optical lens and the compactness of the light emitting device 10, the preferable ratio of the dimension 30D to the dimension 30W is 30D/30W=⅔ to ½.

Assuming that the dimension from the first face 21 to the second face 22 of the light emitting element 20 is the "thickness 20T of the light emitting element 20" as shown in FIGS. 21A and B, the dimension 30W and the thickness 20T can be approximated by the relationship, $\tan \theta_1 = 30W/20T$. Here, when 30W=250 μm and 20T=150 μm, for example, the tilt angle $\theta_1 = 59°$, which can increase the light extraction efficiency.

As discussed earlier, the preferable tilt angle $\theta_1$ is from 40° to 60°. Thus, once the thickness 20T of the light emitting element 20 is determined, the preferable range of 30W can also be determined.

Covering Member 40, 403

The covering member 40 or 403 is formed from a material that satisfies a prescribed relationship in terms of the thermal expansion coefficient with the light transmissive member 30 and the light emitting element 20. In other words, the material for the covering member 40 or 403 is selected so that the thermal expansion coefficient difference $\Delta T_{40}$ between the covering member 40/403 and the light emitting element 20 is smaller than the thermal expansion coefficient difference $\Delta T_{30}$ between the light transmissive member 30 and the light emitting element 20. For example, when the light emitting element 20 includes a light transmittive substrate 27 made of sapphire and a semiconductor stack 28 made of a GaN-based semiconductor, the thermal expansion coefficient of the light emitting element 20 would be in a range between 5 and $9 \times 10^{-6}$/K. When the light transmissive member 30 is made of a silicone resin, the thermal expansion coefficient of the light transmissive member 30 would be in a range between 2 and $3 \times 10^{-5}$/K. Accordingly, $\Delta T_{40} < \Delta T_{30}$ can be met by forming the covering member 40 or 403 from a material having a smaller thermal expansion coefficient than that of the silicone resin.

When using a resin material for the covering member 40 or 403, in general, the thermal expansion coefficient would be of the order of $10^{-5}$/K, which is larger than the thermal expansion coefficient of a common light emitting element 20 by one order of magnitude. However, the thermal expansion coefficient of a resin material can be reduced by adding a filler or the like. For example, by adding a filler, such as silica, to a silicone resin, the thermal expansion coefficient can be reduced to that of the silicone resin without adding the filler.

As for the resin materials applicable to the covering member 40 or 403, thermosetting resins, such as silicone resins, silicone modified resins, epoxy resins, and phenol resins are particularly preferable.

The covering member 40 or 403 can be formed using a light reflecting resin. A light reflecting resin means a resin material having 70% or higher reflectance relative to the light from the light emitting element 20, for example. By reflecting the light reaching the covering member 40 or 403 towards the first face 11 (emission face) of the light emitting device 10, the light extraction efficiency of the light emitting device 10 can be increased.

For the light reflecting resin, a light transmissive resin in which a light reflecting substance is dispersed, for example, can be used. Examples of suitable light reflecting substances include titanium oxide, silicon dioxide, titanium dioxide, zirconium dioxide, potassium titanate, alumina, aluminum nitride, boron nitride, and mullite. A light reflecting substance in a granular, fibrous, or thin flake form can be used, but the fibrous form is preferable as it is expected to also have the effect of reducing the thermal expansion coefficient of the covering member 40 or 403.

Wavelength Converting Member 50

The wavelength converting member 50 contains a phosphor and a light transmissive material. For the light transmissive material, a light transmissive resin, glass, or the like, can be used. Light transmissive resins are preferable, and thermosetting resins, such as silicone resins, silicone modified resins, epoxy resins, phenol resins, or the like, as well as thermoplastic resins, such as polycarbonate resins, acrylic resins, methylpentane resins, polynorbornene resins, or the like, can be used. Silicone resins which have good light resistance and heat resistance are particularly suitable.

For phosphors, those that can be excited by the emitted light from the light emitting element 20 are used. Example of phosphors excitable by light emits from a blue light emitting element or ultraviolet light emitting element include cerium-activated yttrium aluminum garnet-based phosphors (Ce:YAG); cerium-activated lutetium aluminum garnet-based phosphors (Ce:LAG); europium- and/or chromium-activated nitrogen-containing calcium aluminosilicate-based phosphors (CaO—Al$_2$O$_3$—SiO$_2$); europium-activated silicate-based phosphors ((Sr,Ba)$_2$SiO$_4$); nitride-based phosphors, such as β-SiAlON phosphors, CASN-based phosphors, SCASN-based phosphors; KSF-based phosphors (K$_2$SiF$_6$:Mn); sulfide-base phosphors, and quantum dot phosphors. By combining these phosphors with a blue or ultraviolet light emitting element, light emitting devices of various emission colors (e.g., a white light emitting device) can be produced.

The wavelength converting member 50 may contain various fillers for the purpose of adjusting the viscosity or the like.

Incidentally, the surface of the light emitting element may be covered by a light transmissive material containing no phosphors, in lieu of the wavelength converting member 50. This light transmissive material may also contain various fillers for the purpose of adjusting the viscosity or the like.

Several embodiments of the invention have been exemplified in the forgoing. It goes without saying, however, that the invention is not limited to those described above, and can be any given device so long as it does not deviate from the spirit and the scope of the invention. Configurations described in one embodiment or example can be applied to other embodiments and examples. Further, regarding each component configuring the present invention, a plurality of structural elements that configures the present invention may be configured as a single part that serves the purpose of a plurality of elements. Or vice versa, a single structural element may be configured as a plurality of parts which serve the purpose of a single element.

What is claimed is:

1. A light emitting device comprising:
   a light emitting element having:
      a first face,
      a second face opposing the first face,
      a plurality of lateral faces extending between the first face and the second face, the plurality of lateral faces including a first lateral face and a second lateral face adjacent to the first lateral face, and
      a plurality of corners, each located where the second face meets two respective ones of the plurality of lateral faces, the plurality of corners including a first corner located where the second face meets the first lateral face and the second lateral face,
   wherein the light emitting element comprises a pair of electrodes at a second face side of the light emitting element;
   a light transmissive member covering a portion of the first lateral face and a portion of an edge where the first lateral face meets the second face, such that the first corner and a portion of the first lateral face adjacent to the first corner are exposed from the light transmissive member; and
   a covering member covering, the first corner of the light emitting element, the portion of the first lateral face adjacent to the first corner, and an exterior of the light transmissive member, such that the pair of electrodes are exposed from the covering member;
   wherein a difference between a thermal expansion coefficient of the covering member and a thermal expansion coefficient of the light emitting element is smaller than a difference between a thermal expansion coefficient of the light transmissive member and the thermal expansion coefficient of the light emitting element.

2. The light emitting device according to claim 1, wherein the exterior of the light transmissive member is tilted outwardly from the second face side towards the first face side of the light emitting element.

3. The light emitting device according to claim 1, wherein:
   the light emitting element is a substantially rectangular parallelepiped having four of the corners, and
   two diagonally positioned corners among the four corners are exposed from the light transmissive member and covered by the covering member.

4. The light emitting device according to claim 1, wherein:
   the light emitting element is a substantially rectangular parallelepiped having four of the corners, and
   two adjacent corners among the four corners and a portion of an edge between said two adjacent corners are exposed from the light transmissive member and covered by the covering member.

5. The light emitting device according to claim 4, wherein all of said four corners of the light emitting element are exposed from the light transmissive member and covered by the covering member.

6. The light emitting device according to claim 1, wherein:
   the light emitting element includes a light transmissive substrate and a semiconductor stack, and
   the light transmissive substrate is disposed on the first face side of the light emitting element, and the semiconductor stack is disposed on the second face side of the light emitting element.

7. The light emitting device according to claim 1, wherein:
   the light transmissive member is made of a light transmissive resin, and the covering member is made of a light reflecting resin.

8. The light emitting device according to claim 1, wherein:
   the light transmissive member has a first face that is flush with the first face of the light emitting element, and
   the first face of the light emitting element and the first face of the light transmissive member are covered by a wavelength converting member.

9. The light emitting device according to claim 1, wherein the first face of the light emitting element is covered by the light transmissive member.

10. The light emitting device according to claim 1, wherein portions of both the first lateral face and the second lateral face adjacent to the first corner are exposed from the light transmissive member and covered by the covering member.

11. The light emitting device according to claim 1, wherein a portion of an edge where the first lateral face meets the second lateral face is exposed from the light transmissive member and covered by the covering member.

12. The light emitting device according to claim 1, further comprising:
   a wavelength converting member,
   wherein a portion of the light transmissive member is located between the first face of the light emitting element and the wavelength converting member.

13. The light emitting device according to claim 1, wherein lateral faces of the electrodes are covered by the covering member.

14. The light emitting device according to claim 1, wherein:

the pair of electrodes comprises a first electrode and a second electrode, and a shape of an exposed surface of the first electrode is different from a shape of an exposed surface of the second electrode.

15. A light emitting device comprising:

a light emitting element having:

a first face, a second face opposing the first face, a plurality of lateral faces extending between the first face and the second face, the plurality of lateral faces including a first lateral face and a second lateral face adjacent to the first lateral face, and a plurality of corners, each located where the second face meets two respective ones of the plurality of lateral faces, the plurality of corners including a first corner located where the second face meets the first lateral face and the second lateral face, wherein the light emitting element comprises a pair of electrodes at a second face side of the light emitting element;

a light transmissive member covering a portion of the first lateral face and a portion of an edge where the first lateral face meets the second face, such that the first corner and a portion of an edge where the first lateral face meets the second lateral face are exposed from the light transmissive member; and a covering member covering the first corner of the light emitting element, the portion of the edge where the first lateral face meets the second lateral face, and an exterior of the light transmissive member, such that the pair of electrodes are exposed from the covering member;

wherein a thermal expansion coefficient of the covering member is lower than a thermal expansion coefficient of the light transmissive member.

16. The light emitting device according to claim 15, wherein the exterior of the light transmissive member is tilted outwardly from the second face side towards the first face side of the light emitting element.

17. The light emitting device according to claim 15, wherein:

the light emitting element is a substantially rectangular parallelepiped having four of the corners, and two diagonally positioned corners among the four corners are exposed from the light transmissive member and covered by the covering member.

18. The light emitting device according to claim 15, wherein:

the light emitting element is substantially a rectangular parallelepiped having four of the corners, and two adjacent corners among the four corners and a portion of an edge between said two adjacent corners are exposed from the light transmissive member and covered by the covering member.

19. The light emitting device according to claim 18, wherein all of said four corners of the light emitting element are exposed from the light transmissive member and covered by the covering member.

20. The light emitting device according to claim 15, wherein portions of both the first lateral face and the second lateral face adjacent to the first corner are exposed from the light transmissive member and covered by the covering member.

21. The light emitting device according to claim 15, wherein a portion of an edge where the first lateral face meets the second lateral face is exposed from the light transmissive member and covered by the covering member.

22. The light emitting device according to claim 15, further comprising:

a wavelength converting member, wherein a portion of the light transmissive member is located between the first face of the light emitting element and the wavelength converting member.

23. The light emitting device according to claim 15, wherein lateral faces of the electrodes are covered by the covering member.

24. The light emitting device according to claim 15, wherein:

the pair of electrodes comprises a first electrode and a second electrode, and a shape of an exposed surface of the first electrode is different from a shape of an exposed surface of the second electrode.

* * * * *